United States Patent
Park et al.

(10) Patent No.: US 9,543,322 B2
(45) Date of Patent: Jan. 10, 2017

(54) METHODS FOR PRODUCING A THIN FILM FERROELECTRIC DEVICE USING A TWO-STEP TEMPERATURE PROCESS ON AN ORGANIC POLYMERIC FERROELECTRIC PRECURSOR MATERIAL STACKED BETWEEN TWO CONDUCTIVE MATERIALS

(71) Applicant: SABIC Global Technologies B.V., Bergen op Zoom (NL)

(72) Inventors: Ji Hoon Park, Thuwal (SA); Husam N. Alshareef, Thuwal (SA); Ihab N. Odeh, Thuwal (SA); Mohd A. Khan, Thuwal (SA)

(73) Assignee: SABIC Global Technologies B.V., Amsterdam (NL)

( * ) Notice: Subject to any disclaimer, the term of this patent is extended or adjusted under 35 U.S.C. 154(b) by 0 days.

(21) Appl. No.: 14/902,114

(22) PCT Filed: Jun. 4, 2015

(86) PCT No.: PCT/US2015/034126
§ 371 (c)(1),
(2) Date: Dec. 30, 2015

(87) PCT Pub. No.: WO2016/039831
PCT Pub. Date: Mar. 17, 2016

(65) Prior Publication Data
US 2016/0225775 A1    Aug. 4, 2016

Related U.S. Application Data

(60) Provisional application No. 62/047,787, filed on Sep. 9, 2014.

(51) Int. Cl.
*H01L 27/115*    (2006.01)
*H01L 29/51*    (2006.01)
(Continued)

(52) U.S. Cl.
CPC ......... *H01L 27/1159* (2013.01); *C09D 127/16* (2013.01); *H01L 21/02118* (2013.01);
(Continued)

(58) Field of Classification Search
CPC ........ H01L 21/321; H01L 21/02; H01L 21/28; H01L 21/02118; H01L 21/28176; H01L 21/02282; H01L 27/115; H01L 27/1159; H01L 27/11507; H01L 29/516; H01L 29/6684; H01L 29/78391; H01L 37/02; H01L 37/025; H01L 41/113; H01L 41/1132; H01L 41/193; H01L 41/317; C09D 127/16
(Continued)

(56) References Cited

U.S. PATENT DOCUMENTS

| 4,241,128 A | 12/1980 | Wang ............................. 428/212 |
| 6,514,835 B1 | 2/2003 | Hendrix et al. .............. 438/457 |

(Continued)

FOREIGN PATENT DOCUMENTS

| CN | 103113602 | 5/2013 |
| JP | 2001298164 | 10/2001 |

OTHER PUBLICATIONS

Kang et al., Advanced Functional Materials 19(17):2812-2818, 2009.*

(Continued)

*Primary Examiner* — Marc Armand
*Assistant Examiner* — Younes Boulghassoul
(74) *Attorney, Agent, or Firm* — Norton Rose Fulbright US LLP

(57) ABSTRACT

Methods for producing ferroelectric device are described. A method includes positioning an organic polymeric ferroelectric layer between two conductive materials to form a stack. The stack can be subjected to a 2-step heat treating process.

(Continued)

The first heat treating step transforms the organic polymeric ferroelectric precursor to a ferroelectric material having ferroelectric hysteresis properties, and the second heat treating step densities the ferroelectric material to obtain the ferroelectric device. The thin film ferroelectric device can include a thin film ferroelectric capacitor, a thin film ferroelectric transistor, or a thin film ferroelectric diode.

21 Claims, 15 Drawing Sheets

(51) Int. Cl.
| H01L 21/28 | (2006.01) |
| H01L 29/78 | (2006.01) |
| C09D 127/16 | (2006.01) |
| H01L 29/66 | (2006.01) |
| H01L 21/02 | (2006.01) |
| H01L 21/321 | (2006.01) |
| H01L 37/02 | (2006.01) |
| H01L 41/113 | (2006.01) |
| H01L 41/193 | (2006.01) |
| H01L 41/317 | (2013.01) |

(52) U.S. Cl.
CPC .. *H01L 21/02282* (2013.01); *H01L 21/28176* (2013.01); *H01L 21/321* (2013.01); *H01L 27/11507* (2013.01); *H01L 29/516* (2013.01); *H01L 29/6684* (2013.01); *H01L 29/78391* (2014.09); *H01L 37/025* (2013.01); *H01L 41/1132* (2013.01); *H01L 41/193* (2013.01); *H01L 41/317* (2013.01)

(58) Field of Classification Search
USPC .............. 257/532, 295, 40; 428/457, 690
See application file for complete search history.

(56) References Cited

U.S. PATENT DOCUMENTS

| 7,173,842 | B2 | 2/2007 | Isenberger et al. .......... 365/145 |
| 7,396,692 | B2 | 7/2008 | Windlass et al. ................. 438/3 |
| 8,120,082 | B2 | 2/2012 | Park ............................. 257/295 |
| 2003/0157766 | A1* | 8/2003 | Uchiyama ........... H01L 21/3105 438/240 |
| 2003/0162394 | A1 | 8/2003 | Takemura ..................... 438/689 |
| 2007/0045689 | A1 | 3/2007 | Lim et al. ..................... 257/295 |
| 2007/0126042 | A1 | 6/2007 | Kijima et al. ................ 257/295 |
| 2008/0063983 | A1* | 3/2008 | Lo ......................... H01L 51/052 430/311 |
| 2008/0128682 | A1* | 6/2008 | Park ........................ G11C 11/22 257/40 |
| 2009/0263671 | A1 | 10/2009 | Yao et al. ..................... 428/457 |
| 2011/0152443 | A1* | 6/2011 | Ito ............................ C08J 3/091 524/546 |
| 2012/0032300 | A1 | 2/2012 | Wang ............................ 257/532 |
| 2013/0230942 | A1 | 9/2013 | Nalwa et al. .................. 438/82 |
| 2014/0264515 | A1* | 9/2014 | Fabiano ........... H01L 29/66477 257/295 |

OTHER PUBLICATIONS

Rozana et al., 2012 IEEE Symposium on Humanities, Science and Engineering Research (SHUSER), pp. 749-753, 2012.*
Bihler et al., *IEEE Transactions on Electrical Insulation* 24(3):541-544, 1989.
Kang et al. *Applied Physics Letters* 92(1):012921-3, 2008.
Kang et al., *Advanced Functional Materials* 19(17):2812-2818, 2009.
Kang et al., *Advanced Materials* 19(4):581-586, 2007.
Kang et al., *Nano Lett.* 11(1):138-144, 2011.
Kim et al., *Nature Communications* 5(3583):1-12, 2014.
Koga et al., *Journal of Applied Physics* 59(6):2142-2150, 1986.
Lau et al., *Advances in Condensed Matter Physics* 2013(435938):1-5, 2013.
Leonard et al., *Macromolecules* 21(10):2988-2994, 1988.
Lhoste, *Development of PVDF Micro and Nanostructures for Cell Culture Studies*, 2012.
Li et al., *Applied Physics Letters* 103:072903-1, 2013.
Salimi et al., *Polymer Testing* 22(6):699-704, 2003.
Scheinbeim et al., *Journal of Applied Physics* 50(6):4399-4405, 1979.
Shin et al., *ACS Appl. Mater. Interfaces* 3(2):582-589, 2011.
Yang et al., *Journal of Materials Science Letters* 6(5):593-598, 1987.
International Search Report and Written Opinion for PCT/US2015/034126, mailed Oct. 29, 2015.

* cited by examiner

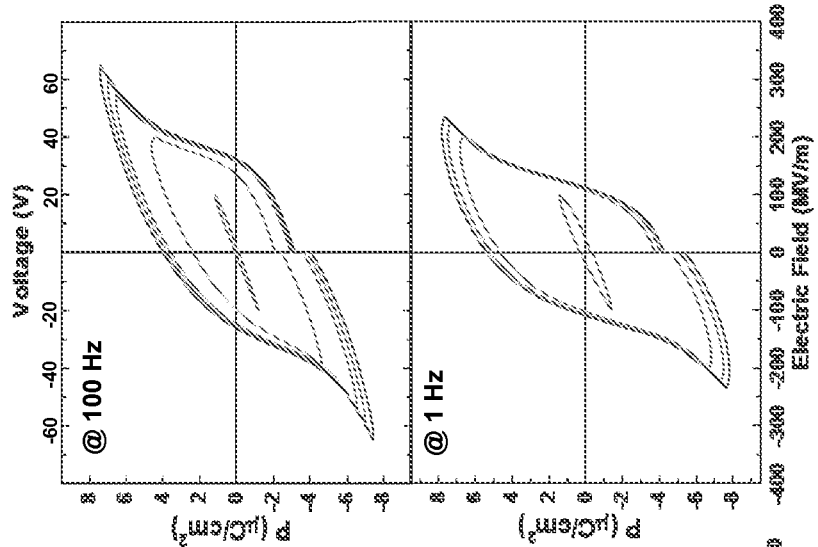
FIG. 14A @ 1 kHz
FIG. 14C @ 100 Hz
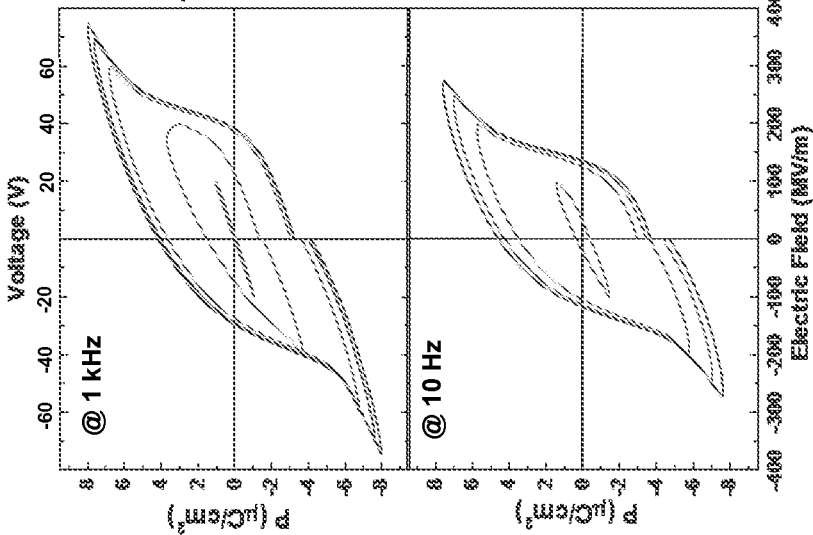
FIG. 14B @ 10 Hz
FIG. 14D @ 1 Hz

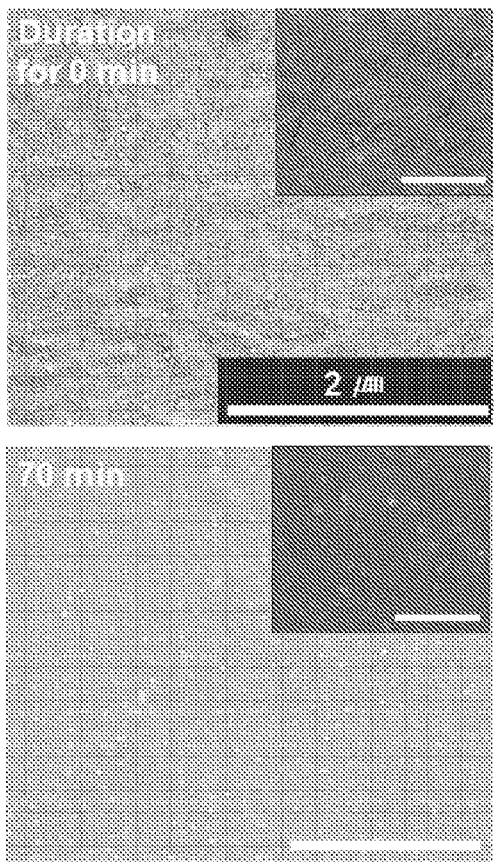
FIG. 15A
FIG. 15B
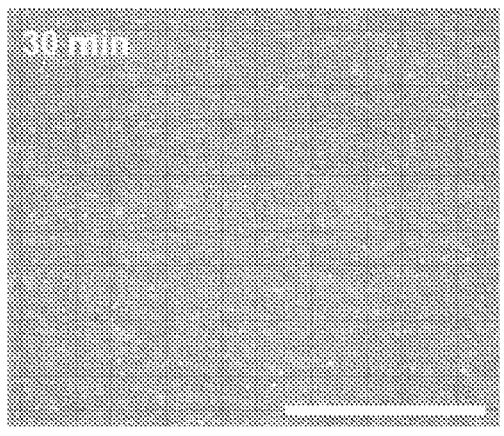
FIG. 15C
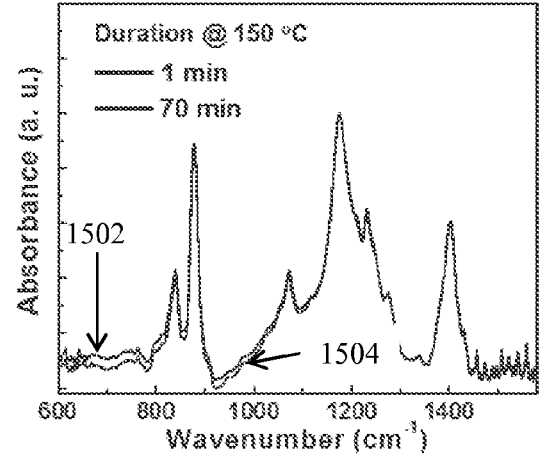
FIG. 16

METHODS FOR PRODUCING A THIN FILM FERROELECTRIC DEVICE USING A TWO-STEP TEMPERATURE PROCESS ON AN ORGANIC POLYMERIC FERROELECTRIC PRECURSOR MATERIAL STACKED BETWEEN TWO CONDUCTIVE MATERIALS

CROSS REFERENCE TO RELATED APPLICATIONS

This application is a national phase application under 35 U.S.C. §371 of International Application No. PCT/US2015/034126, filed Jun. 4, 2015, which claims benefit to U.S. Provisional Patent Application No. 62/047,787 titled "METHODS FOR PRODUCING A THIN FILM FERROELECTRIC DEVICE USING A TWO-STEP TEMPERATURE PROCESS" filed Sep. 9, 2014. The entire contents of each of the above-referenced disclosures are specifically incorporated herein by reference without disclaimer.

BACKGROUND OF THE INVENTION

A. Field of the Invention

The present invention generally relates to a method of producing ferroelectric films (e.g., poly(vinylidene fluoride) (PVDF) based films) and memory devices through a controlled two-step thermal annealing process.

B. Description of Related Art

Memory systems are used for storage of data, program code, and/or other information in many electronic products, such as personal computer systems, embedded processor-based systems, video image processing circuits, portable phones, and the like. Important characteristics for a memory cell in electronic device are low cost, nonvolatility, high density, writability, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

More recently, ferromagnetic RAM (FRAM) has been attempted. FRAM utilizes a ferromagnetic region or film of a ferroelectric capacitor, thin film transistor, or diode to generate a nonvolatile memory cell. Such electronic devices are fabricated using two parallel conductive plates separated by a ferroelectric polymer layer. The ferroelectric polymer layer is a layer of insulating film which contains a permanent electrical polarization that can be reversed repeatedly, by an opposing electric field. As a result, the ferroelectric capacitor, thin film transistor, or diode has two possible non-volatile states, which they can retain without electrical power, corresponding to the two binary logic levels in a digital memory. Additionally, ferroelectric capacitors, transistors, and diodes also provide energy-storing functionality. When a voltage is applied across the plates, the electric field in the ferroelectric material displaces electric charges, and thus stores energy. The amount of energy stored depends on the dielectric constant of the insulating material and the dimensions (total area and thickness) of the film.

Typically, poly(vinylidene fluoride) (PVDF) type polymers or copolymers (e.g., a copolymer of PVDF with trifluoroethylene (TrFe) (PVDF-TrFe)) are used as the ferroelectric material due to their large polarization values and electrical and material properties. PVDF type polymers are attractive for electronic devices as they can be produced in the form of films and in a variety of shapes, have high chemical resistance, and high efficiency in converting mechanical energy to electrical energy. PVDF has five different polymorphs (also referred to as phases), alpha ($\alpha$), beta ($\beta$), gamma ($\gamma$), delta ($\delta$) and epsilon ($\in$), with the most common of the polymorphs being the alpha ($\alpha$) polymorph. The alpha polymorph demonstrates little to no ferroelectric properties, while the remaining phases demonstrate stronger ferroelectric properties, with the beta-polymorph being most preferred.

Many attempts have been made to transform the alpha-polymorph to the more desirable polymorphs using various techniques. Two problems, however, continue to arise with the currently available processes. For one, after deposition and annealing of PVDF using solution processes (e.g., spin-coating), the resulting PVDF film oftentimes demonstrates a para-electric ($\alpha$) phase rather than the desired ($\beta$)-phase. Second, and also after annealing, nano-size cracks routinely develop on the PVDF film, which are detrimental to the film's stable operation under applied voltage.

For instance, Kang in Applied Physics Letters, 2008, Vol. 92, pp. 012921-3 describes a 1-step rapid annealing process at 150° C. The resulting films, however, exhibited a micro-pattern of ($\alpha$) and ($\beta$) PVDF crystals, confirming a less than desired transition process.

Chinese Application Publication No. CN 103113602 and U.S. Pat. No. 6,514,835 each attempt to address the para-electric ($\alpha$)-phase/($\beta$)-phase transition by applying pressure or stress to PVDF material during the annealing process, thereby complicating film formation process.

U.S. Pat. No. 8,120,082, by comparison, attempts to solve the phase transition problem through a heating and cooling step. In particular, the PVDF material is heated to a first temperature, which is followed by continuous cooling to an established temperature to effect ($\beta$)-phase of the ferroelectric film, which is then followed by rapid cooling (60° C. to 70° C.) so that the film is fixed in the ($\beta$)-phase. No attempt, however, is made to solve the problems associated with nano-size crack formation in the resulting films.

SUMMARY OF THE INVENTION

A solution to the problems associated with the poor durability of ferroelectric films used in memory devices has been identified. The solution resides in the use of a controlled thermal annealing process of ferroelectric precursor material (e.g., ($\alpha$)-phase PVDF) that allows for the transition of the precursor material into material having ferroelectric hysteresis properties (e.g., ($\gamma$)-phase PVDF or ($\beta$)-phase PVDF), while also reducing or removing interfacial voids or cracks in the resulting material. The process includes a first step, which is preferably performed after deposition of a top conductive material (e.g., electrode), that includes heating an organic polymeric ferroelectric precursor material to a temperature above its melting point for a sufficient period of time to effect phase transition of the precursor material to a material having ferroelectric hysteresis properties (e.g., 167° C. to 200° C. for 1 to 60 minutes for PVDF-based films). This is followed with a second step that includes cooling the material to a temperature below its melting point for a sufficient period of time to effect densification of the material, which reduces or removes interfacial voids within the produced material (e.g., 100° C. to less than 167° C. for 10 to 70 minutes). Without wishing to be bound by theory, it is believed that the first annealing step allows for the efficient transition of the precursor material into the material having ferroelectric hysteresis properties (for example, PVDF gamma morphology), while the second step allows for the densification of the material to remove or reduce interfacial voids or cracks in the surface of the material while maintaining the ferroelectric hysteresis properties. Notably, this thermal annealing process can be performed after the electronic device has been constructed but prior to phase transition of the ferroelectric material (e.g., a stack of a first conductive layer, a ferroelectric precursor layer, and a second conductive layer, with the precursor layer positioned between the conductive layers, can be subjected to the process of the present invention). Further, no additional mechanical stretching of the ferroelectric material and no additional temperature steps such as fast cooling is needed, thereby allowing for an elegant and efficient process for making ferroelectric electronic devices (e.g., capacitors, transistors, diodes, piezoelectric devices, pyroelectric devices, etc.).

In one particular aspect, there is disclosed a method for producing a thin film ferroelectric device. The method includes (a) depositing an organic polymeric ferroelectric precursor material onto a first conductive material such that the precursor material has a first surface and an opposing second surface, wherein the first surface of the precursor material is in contact with the first conductive material; (b) depositing a second conductive material on the second surface of the precursor material to form a stack, wherein the precursor material is positioned at least partially between the first and second conductive materials; (c) subjecting the stack to a first temperature above a melting temperature of the precursor material to form an organic polymeric ferroelectric material having ferroelectric hysteresis properties; and (d) subjecting the stack to a second temperature below a melting temperature of the organic polymeric ferroelectric material to densify the organic polymeric ferroelectric material and to obtain a thin film ferroelectric device. In some aspects, the produced thin film ferroelectric device exhibits a polarization versus electric field (P-E) hysteresis loop that is measurable as low as 1 Hz. In certain aspects of the invention, the first temperature in step (c) can be 167° C. to 200° C. or 175° C. to 185° C., and the second temperature in step (d) can be 100° C. to less than 167° C. or 145° C. to 155° C. In some aspects, steps (c) and (d) are continuous such that the stack in step (c) is cooled from the first temperature to the second temperature. The stack can be subjected to the (i) first temperature for 1 to 60 minutes, 10 to 50 minutes or 20 to 30 minutes, and (ii) second temperature for 10 to 70 minutes, 20 to 60 minutes, or 30 to 50 minutes. In one aspect, the precursor material, prior to step (c), has not previously been subjected to a thermal treatment for more than 55 minutes, preferably for more than 30 minutes, more preferably for more than 5 minutes, or most preferably not been subjected to any thermal treatment. The polymeric ferroelectric precursor material can be solubilized in a solvent prior to performing step (c), and the solvent is substantially removed in step (c) to produce the polymeric ferroelectric material having ferroelectric hysteresis properties. In some aspects, a crystalline phase is formed in the precursor material in step (c) to form the organic polymeric ferroelectric material having ferroelectric hysteresis properties. Said another way, the precursor material is not in crystalline or semi-crystalline form prior to performing step (c), and the polymeric ferroelectric material having ferroelectric hysteresis properties is in crystalline or semi-crystalline form after performing step (c). If any interfacial cracks are present in the organic polymeric ferroelectric material having ferroelectric hysteresis properties obtained in step (c), they can be substantially removed in step (d), thereby reducing leakage current in the ferroelectric material when compared with the ferroelectric material obtained in step (c). In some aspects of the invention, the precursor material in steps (a) and (b) does not exhibit ferroelectric hysteresis properties. The organic polymeric ferroelectric precursor material in step (a) can be deposited onto the first conductive material by spray coating, ultra sonic spray coating, roll-to-roll coating, ink jet printing, screen printing, drop casting, spin coating, dip coating, Mayer rod coating, gravure coating, slot die coating, doctor blade coating, extrusion coating, flexography, gravure, offset, rotary screen, flat screen, ink-jet, laser ablation, or any combination thereof. The precursor material can be deposited in step (a) as a film having a thickness of less than 1 μm and the resulting organic polymeric ferroelectric material in step (d) is in the form of a film having a thickness of less than 1 μm. In some aspects of the invention, the first or second conductive material, or both, each individually can include conductors such as a metal, metal oxides or a metal alloy. The metal can include platinum, gold, aluminum, silver, silicon, or copper, a metal oxide thereof, or any combination or alloy thereof. In another aspect, the second conductive material can be deposited on the precursor material in step (b) by spray coating, ultra sonic spray coating, roll-to-roll coating, ink jet printing, screen printing, drop casting, spin coating, dip coating, Mayer rod coating, gravure coating, slot die coating, doctor blade coating or extrusion coating. In one aspect of the invention, the first and second conductive materials are not subjected to tensile stress during steps (a) to (d). In other aspects of the invention, no curing agent is used or contained in the polymeric ferroelectric precursor material in step (a). In other aspects, the metal can be deposited by other known thin film manufacturing processes. Substantially no cross-linking occurs in the organic polymeric ferroelectric material having ferroelectric hysteresis properties.

In some aspects of the invention, steps (a) and (d) can be performed in a roll-to-roll process. A roll-to-roll method can include (i) obtaining a substrate uncoiled from a roll; (ii) depositing the first conductive material onto at least a portion of a surface of the substrate; (iii) depositing the precursor material onto at least a portion of a surface of the first conductive material such that ferroelectric precursor material comprises a first surface and an opposing second surface that is in contact with the first conductive material; (iv) depositing the second conductive material onto at least a portion of the opposing surface of the precursor material to form a stack; (v) subjecting the stack to a first temperature above a melting temperature of the precursor material to form an organic polymeric ferroelectric material having ferroelectric hysteresis properties; and (vi) subjecting the heated stack to a second temperature below a melting temperature of the organic polymeric ferroelectric material to densify the organic polymeric ferroelectric material and to obtain a thin film ferroelectric device. In one aspect, steps (ii) and (vi) are performed at a rate of 100 m²/s or less.

In another aspect of the invention, a method of producing a thin film ferroelectric device includes (a) subjecting a stack that includes a first conductive material, a second conductive material, and an organic polymeric ferroelectric precursor material at least partially between the first and second conductive materials to a first temperature above a melting temperature of the precursor material to form an organic polymeric ferroelectric material having ferroelectric hysteresis properties; and (b) subjecting the stack to a second temperature below a melting temperature of the organic polymeric ferroelectric material to densify the organic polymeric ferroelectric material and to obtain a thin film ferroelectric capacitor or thin film transistor.

In other aspect of the invention a thin ferroelectric device is produced using the methods described throughout this specification. The ferroelectric device can include a first conductive material and a second conductive material. At least a portion of the ferroelectric material is between at least a portion of the first conductive material and at least a portion of the second conductive material. In some aspects, the ferroelectric device can be placed on a flexible and non-flexible substrates such as, silicon, plastic, or paper. The thin film ferroelectric device can be a thin film capacitor, a thin film transistor, or a thin film diode.

In some aspects, the polymeric ferroelectric precursor material can include a ferroelectric polymer. In some aspects of the invention, the precursor material includes a ferroelectric polymer and an inorganic material. The ferroelectric polymer can be a PVDF-based polymer or a blend of that includes a PVDF-based polymer. The PVDF-based polymer can be a homopolymer, a copolymer, or a terpolymer, or a blend thereof. In some aspects of the invention, the PVDF can have a molecular weight varying from 180 kg/mol to 534 kg/mol. In some aspects of the invention, the polymeric ferroelectric precursor material can include polyundecanoamide (Nylon 11)-based polymer, or a blend thereof. The PVDF-based polymer can be blended with a non-PVDF polymer such as poly(phenylene oxide) (PPO), a polystyrene (PS), or a poly(methyl methacrylate) (PMMA), or a blend thereof. PVDF-based polymers include PVDF, a poly(vinylidene fluoride-tetrafluoroethylene) (PVDF-TrFE), or a poly(vinylidene-fluoride-co-hexafluoropropene) (PVDF-HFP), poly(vinylidene fluoride-co-chlorotrifluoroethylene) (PVDF-CTFE), poly(vinylidene fluoride-co-chlorofluoroethylene) (PVDF-CFE), poly(vinylidene fluoride-co-chlorodifluoroethylene) (PVDF-CDFE), poly(vinylidene fluoride-co-trifluoroethylene-co-chlorofluoroethylene) (PVDF-TrFE-CFE), poly(vinylidene fluoride-co-trifluoroethylene-co-chlorotrifluoroethylene) (PVDF-TrFE-CTFE), poly(vinylidene fluoride-co-trifluoroethylene-co-hexafluoropropylene) (PVDF-TrFE-HFP), poly(vinylidene fluoride-co-trifluoroethylene-co-chlorodifluoroethylene) (PVDF-TrFE-CDFE), poly(vinylidene fluoride-co-tetrafluoro ethylene-co-chlorofluoroethylene) (PVDF-TFE-CFE), poly(vinylidene fluoride-co-tetrafluoroethylene-co-chlorotrifluoro ethylene) (PVDF-TFE-CTFE), poly(vinylidene fluoride-co-tetrafluoroethylene-co-hexafluoropropylene) (PVDF-TFE-HFP), and poly(vinylidene fluoride-co-tetrafluoroethylene-co-chlorodifluoroethylene) (PVDF-TFE-CD FE), or a polymeric blend thereof, or more preferably, PVDF, PVDF-TrFE, or PVDF-TrFE-CtFE. In some aspects, the ferroelectric layer having ferroelectric hysteresis properties can be an inorganic layer such as PZT ($Pb(Zr_xTi_{1-x})O_3$), $BaTiO_3$, or a combination. In a particular aspect, the ferroelectric layer having ferroelectric hysteresis properties can have a thickness of 5 nm to 1000 nm.

Another aspect of the invention, the ferroelectric device of the present invention can be used in an electronic device, a printed circuit board or an integrated circuit. For example, the ferroelectric device of the present invention can be included in at least a portion of a communications circuit, a sensing circuit, or a control circuit of the electronic device, the printed circuit board or the integrated circuit. The circuit can be a piezoelectric sensor, piezoelectric transducer, piezoelectric actuator, a pyroelectric sensor, a pyroelectric sensor, a pyroelectric transducer, or a pyroelectric actuator.

Further, electronic devices comprising the ferroelectric material or the ferroelectric device of the present invention are also contemplated.

In a further embodiment of the present invention there is disclosed a method of decoupling a circuit from a power supply with a ferroelectric device of the present invention. The method can include disposing the ferroelectric device between a power voltage line and a ground voltage line, wherein the ferroelectric device is coupled to the power voltage line and to the ground voltage line, and wherein a reduction in power noise generated by the power voltage and the ground voltage is achieved.

Also disclosed is a method for operating an energy storage circuit that includes a ferroelectric device of the present invention, which provides electrical power to a consuming device when electrical power from a primary source is unavailable. The method can include: (1) defining a target energy level for the ferroelectric device, wherein the target energy level is based on a selected material weight percentage of the second polymer in the ferroelectric material; (2) charging the device; (3) measuring a first amount of energy that is stored in the ferroelectric device during charging; (4) terminating charging of the ferroelectric device when the first amount of energy stored in the device reaches the target energy level; and (5) discharging the device into the consuming device, such as when electrical power from the primary source becomes unavailable.

In another aspect of the invention a method of operating a piezoelectric sensor, a piezoelectric transducer, or a piezoelectric actuator using the ferroelectric device of the present invention is disclosed. In some aspects of the invention a method of operating a pyroelectric sensor, a pyroelectric transducer, or a pyroelectric actuator using the ferroelectric device of the present invention is disclosed. Examples of pyroelectric sensors include a passive infra-red detector, an infra-red imaging array, and a fingerprint sensor.

Also disclosed in the context of the present invention are embodiments 1 to 48. Embodiment 1 is a method for producing a thin film ferroelectric device. The method includes (a) depositing an organic polymeric ferroelectric precursor material onto a first conductive material such that the precursor material has a first surface and an opposing second surface, wherein the first surface of the precursor material is in contact with the first conductive material; (b) depositing a second conductive material on the second surface of the precursor material to form a stack, wherein the precursor material is positioned at least partially between the first and second conductive materials; (c) subjecting the stack to a first temperature above a melting temperature of the precursor material to form an organic polymeric ferroelectric material having ferroelectric hysteresis properties; and (d) subjecting the stack to a second temperature below a melting temperature of the organic polymeric ferroelectric material to densify the organic polymeric ferroelectric material and to obtain a thin film ferroelectric device. Embodiment 2 is the method of embodiment 1, wherein obtaining a thin film ferroelectric device includes producing a ferroelectric capacitor, transistor, diode, piezoelectric, pyroelectric device, or any combination thereof. Embodiment 3 is the method of any one of embodiments 1 to 2, wherein the first temperature in step (c) is 167° C. to 200° C., and the second temperature in step (d) is 100° C. to less than 167° C. Embodiment 4 is the method of embodiment 3, wherein the first temperature in step (c) is 175° C. to 185° C., and the second temperature in step (d) is 145° C. to 155° C. Embodiment 5 is the method of any one of embodiments 1 to 4, wherein steps (c) and (d) are continuous such that the stack in step (c) is cooled from the first temperature to the second temperature. Embodiment 6 is the method of any one of embodiments 1 to 5, wherein the stack is subjected to the (i) first temperature for 1 to 60 minutes and (ii) second temperature for 10 to 70 minutes. Embodiment 7 is the method of any one of embodiments 1 to 6, wherein the organic polymeric ferroelectric precursor material in step (a) is deposited onto the first conductive material by spray coating, ultra sonic spray coating, roll-to-roll coating, ink jet printing, screen printing, drop casting, spin coating, dip coating, Mayer rod coating, gravure coating, slot die coating, doctor blade coating, extrusion coating, flexography, gravure, offset, rotary screen, flat screen, ink-jet, laser ablation, or any combination thereof. Embodiment 8 is the method of any one of embodiments 1 to 7, wherein the second conductive material is deposited on the precursor material in step (b) by spray coating, ultra sonic spray coating, roll-to-roll coating, ink jet printing, screen printing, drop casting, spin coating, dip coating, Mayer rod coating, gravure coating, slot die coating, doctor blade coating, extrusion coating, or any combination thereof. Embodiment 9 is the method of any one of embodiments 1 to 8, wherein the precursor material is deposited in step (a) as a film having a thickness of less than 1 μm and the resulting organic polymeric ferroelectric material in step (d) is in the form of a film having a thickness of less than 1 μm. Embodiment 10 is the method of any one of embodiments 1 to 9, wherein the precursor material, prior to step (c), has not previously been subjected to a thermal treatment for more than 55 minutes, preferably for more than 30 minutes, more preferably for more than 5 minutes, or most preferably not been subjected to any thermal treatment. Embodiment 11 is the method of any one of embodiments 1 to 10, wherein the first and second conductive materials are not subjected to tensile stress during steps (a) to (d). Embodiment 12 is the method of any one of embodiments 1 to 11, wherein the precursor material in steps (a) and (b) does not exhibit ferroelectric hysteresis properties. Embodiment 13 is the method of any one of embodiments 1 to 12, wherein a crystalline phase is formed in the precursor material in step (c) to form the organic polymeric ferroelectric material having ferroelectric hysteresis properties. Embodiment 14 is the method of any one of embodiments 1 to 13, wherein interfacial cracks present in the organic polymeric ferroelectric material having ferroelectric hysteresis properties obtained in step (c) are substantially removed in step (d), thereby reducing leakage current in the ferroelectric material when compared with the ferroelectric material obtained in step (c). Embodiment 15 is the method of any one of embodiments 1 to 14, wherein the produced thin film ferroelectric device exhibits a polarization vs. electric field (P-E) hysteresis loop that is measurable as low as 1 Hz. Embodiment 16 is the method of any one of embodiments 1 to 15, wherein the precursor material is not in crystalline or semi-crystalline form prior to performing step (c), and wherein the polymeric ferroelectric material having ferroelectric hysteresis properties is in crystalline or semi-crystalline form after performing step (c). Embodiment 17 is the method of any one of embodiments 1 to 16, wherein the polymeric ferroelectric precursor material is solubilized in a solvent prior to performing step (c), and wherein the solvent is substantially removed in step (c) to produce the polymeric ferroelectric material having ferroelectric hysteresis properties. Embodiment 18 is the method of any one of embodiments 1 to 17, wherein the polymeric ferroelectric precursor material in step (a) comprises a ferroelectric polymer. Embodiment 19 is the method of embodiment 18, wherein the ferroelectric polymer is a polyvinylidene fluoride (PVDF)-based polymer or a blend comprising a PVDF-based polymer. Embodiment 20 is the method of embodiment 19, wherein the PVDF-based polymer is a homopolymer, a copolymer, or a terpolymer, or a blend thereof. Embodiment 21 is the method of embodiment 19, wherein the PVDF can have molecular weights varying from 180 kg/mol to 534 kg/mol. Embodiment 22 is the method of any one of embodiments 19 to 20, wherein the PVDF-based polymer is blended with a non-PVDF-based polymer. Embodiment 23 is the method of embodiment 22, wherein the non-PVDF polymer is a poly(phenylene oxide) (PPO), a polystyrene (PS), or a poly(methyl methacrylate) (PMMA), or a blend thereof. Embodiment 24 is the method of any one of embodiments 19 to 23, wherein the PVDF-based polymer is PVDF, a poly(vinylidene fluoride-tetrafluoroethylene) (PVDF-TrFE), or a poly(vinylidene-fluoride-co-hexafluoropropene) (PVDF-HFP), poly(vinylidene fluoride-co-chlorotrifluoroethylene) (PVDF-CTFE), poly(vinylidene fluoride-co-chlorofluoroethylene) (PVDF-CFE), poly(vinylidene fluoride-co-chlorodifluoroethylene) (PVDF-CDFE), poly (vinylidene fluoride-co-trifluoroethylene-co-chlorofluoroethylene) (PVDF-TrFE-CFE), poly(vinylidene fluoride-co-trifluoroethylene-co-chlorotrifluoroethylene) (PVDF-TrFE-CTFE), poly(vinylidene fluoride-co-trifluoroethylene-co-hexafluoropropylene) (PVDF-TrFE-HFP), poly(vinylidene fluoride-co-trifluoroethylene-co-chlorodifluoroethylene) (PVDF-TrFE-CDFE), poly(vinylidene fluoride-co-tetrafluoroethylene-co-chlorofluoroethylene) (PVDF-TFE-CFE), poly(vinylidene fluoride-co-tetrafluoroethylene-co-chlorotrifluoroethylene) (PVDF-TFE-CTFE), poly(vinylidene fluoride-co-tetrafluoroethylene-co-hexafluoropropylene) (PVDF-TFE-HFP), and poly(vinylidene fluoride-co-tetrafluoroethylene-co-chlorodifluoroethylene) (PVDF-TFE-CDFE), or a polymeric blend thereof. Embodiment 25 is the method of any one of embodiments 1 to 24, wherein steps (a) to (d) are performed in a roll-to-roll process. Embodiment 26 is the method of embodiment 25, further comprising: (i) obtaining a substrate uncoiled from a roll; (ii) depositing the first conductive material onto at least a portion of a surface of the substrate; (iii) depositing the precursor material onto at least a portion of a surface of the first conductive material such that ferroelectric precursor material comprises a first surface and an opposing second surface that is in contact with the first conductive material; (iv) depositing the second conductive material onto at least a portion of the opposing surface of the precursor material to form a stack; (v) subjecting the stack to a first temperature above a melting temperature of the precursor material to form an organic polymeric ferroelectric material having ferroelectric hysteresis properties; and (vi) subjecting the stack to a second temperature below a melting temperature of the organic polymeric ferroelectric material to densify the organic polymeric ferroelectric material and to obtain a thin film ferroelectric device. Embodiment 27 is the method of embodiment 25, wherein steps (ii) and (vi) are performed at a rate of 100 m2/s or less. Embodiment 28 is the method of any one of embodiments 1 to 26, wherein no curing agent is used or contained in the polymeric ferroelectric precursor material in step (a). Embodiment 29 is the method of any one of embodiments 1 to 27, wherein substantially no cross-linking occurs in the organic polymeric ferroelectric material having ferroelectric hysteresis properties. Embodiment 30 is the method of any one of embodiments 1 to 28, wherein the precursor material includes a ferroelectric polymer and an inorganic material. Embodiment 31 is the method of any one of embodiments 1 to 29, wherein the first or second conductive material, or both, each individually comprise a metal. Embodiment 32 is the method of claim 31, wherein the metal is platinum, gold, aluminum, silver, silicon, or copper, a metal oxide thereof, or any combination or alloy thereof.

Embodiment 33 is a method for producing a thin film ferroelectric device. The method includes (a) subjecting a stack comprising a first conductive material, a second conductive material, and an organic polymeric ferroelectric precursor material at least partially between the first and second conductive materials to a first temperature above a melting temperature of the precursor material to form an organic polymeric ferroelectric material having ferroelectric hysteresis properties; and (b) subjecting the stack to a second temperature below a melting temperature of the organic polymeric ferroelectric material to densify the organic polymeric ferroelectric material and to obtain a thin film ferroelectric device.

Embodiment 34 is a ferroelectric device prepared by any one of the methods of embodiments 1 to 32, wherein the ferroelectric device includes a first conductive material and a second conductive material, wherein at least a portion of the ferroelectric material is between at least a portion of the first conductive material and at least a portion of the second conductive material. Embodiment 35 is the ferroelectric device of embodiment 34, wherein the ferroelectric device is comprised on a substrate. Embodiment 36 is the ferroelectric device of embodiment 35, wherein the substrate comprises silicon, plastic, or paper.

Embodiment 37 is a printed circuit board comprising the ferroelectric material produced by the method of any one of embodiments 1 to 33 or the ferroelectric device of any one of embodiments 34 to 36.

Embodiment 38 is the printed circuit board of embodiment 37, wherein the ferroelectric device is comprised in at least a portion of a communications circuit, a sensing circuit, or a control circuit.

Embodiment 39 is an integrated circuit comprising the ferroelectric device of any one of embodiments 34 to 36. Embodiment 40 is the integrated circuit of embodiment 39, wherein the ferroelectric device is comprised in at least a portion of a communications circuit, a sensing circuit, or a control circuit.

Embodiment 41 is an electronic device comprising the ferroelectric device of any one of embodiments 34 to 36.

Embodiment 42 is a method for reading and restoring data to a nonvolatile memory cell comprising the thin film ferroelectric device of any one of embodiments 34 to 36. The method includes (i) applying a voltage to the ferroelectric device; (ii) increasing the voltage by a predetermined amount; (iii) detecting a charge signal that results from increasing said voltage, wherein a charge signal having at least a certain minimum amplitude indicates a change in a previously set polarization state representing a first binary logic level; and (iv) restoring said previously set polarization state in said ferroelectric device if the polarization state has been changed, by altering a polarity of the voltage applied to said ferroelectric device.

Embodiment 43 is a method for writing to a nonvolatile memory cell that includes the ferroelectric device of any one of embodiments 34 to 36. The method includes: (i) applying a voltage to the ferroelectric device; (ii) increasing said voltage by a predetermined amount; (iii) detecting a charge signal that results from increasing the voltage, wherein a charge signal having at least a certain minimum amplitude indicates a change to a second polarization state representing a second binary logic level; (iv) maintaining said second polarization state if said memory cell represents said second binary logic level; and (v) restoring to a first polarization state representing a first binary logic level if memory cell represents a first binary logic level, by altering a polarity the voltage applied to said ferroelectric device.

Embodiment 44 is a method of decoupling a circuit from a power supply with any one of the ferroelectric devices of embodiments 34 to 36. The method includes disposing the ferroelectric device between a power voltage line and a ground voltage line, wherein the ferroelectric device is coupled to the power voltage line and to the ground voltage line, and wherein a reduction in power noise generated by the power voltage and the ground voltage is achieved.

Embodiment 45 is a method for operating an energy storage circuit comprising any one of the ferroelectric devices of embodiments 34 to 36 which provides electrical power to a consuming device when electrical power from a primary source is unavailable. The method includes (i) defining a target energy level for the ferroelectric device (ii) charging the ferroelectric device; (iii) measuring a first amount of energy that is stored in the ferroelectric device during charging; (iv) terminating charging of the ferroelectric device when the first amount of energy stored in the device or thin film transistor reaches the target energy level; and (v) discharging the ferroelectric device into the consuming device when electrical power from the primary source becomes unavailable.

Embodiment 46 is a method for operating a piezoelectric sensor, a piezoelectric transducer, and a piezoelectric actuator using any one of the ferroelectric devices of embodiments 34 to 36.

Embodiment 47 is a method for operating a pyroelectric sensor, a pyroelectric transducer, and a pyroelectric actuator using any one of the ferroelectric devices of embodiments 34 to 36. Embodiment 48 is the method of embodiment 47, wherein the pyroelectric sensor comprises a passive infrared detector, an infra-red imaging array, and a fingerprint sensor.

The term "electrode" as used in the context of the present invention refers to a conductive material coupled to a component to provide an electrical contact point to the component. For example, in certain embodiments, a device may include two electrodes on opposite sides of an insulator material, such as a ferroelectric layer.

The terms "lower" or "bottom" electrode as used in context of the present invention refers to an electrode positioned on a side of a component closest to the supporting substrate.

The terms "upper" or "top" electrode as used in context of the present invention refers to an electrode positioned on a side of a component farthest from the supporting substrate. Although "bottom electrode" and "top electrode" are defined here and described throughout the disclosure, the terms may be interchangeable, such as when a device is separate from the supporting substrate.

The term "ferroelectric precursor material" includes all materials, both organic and inorganic, that have the potential to exhibit ferroelectric hysteresis properties, such as retaining a remnant electric field polarization at zero applied electric field. By way of example, ($\alpha$)-phase PVDF has the potential to exhibit ferroelectric hysteresis properties by phase transition of the ($\alpha$)-phase into the ($\beta$)-phase, ($\gamma$)-phase, or ($\delta$)-phase.

The phrase "low dielectric constant" when referring to a polymer, includes a polymer having a relative permittivity of 4 or less.

The term "tensile strength" refers to an amount of stress and/or deformation a material can endure before failure. For example, the amount of pressure or bending that conductive materials can withstand before they break.

The phrase "polymer blend" includes at least two polymers that have been blended together by any of the known techniques for producing polymer blends. Such techniques include solution blending using a common solvent or melt blend extrusion whereby the components are blended at temperatures above the melting point of the polymers and the obtained mixture is subsequently extruded into granules or directly into sheets or any other suitable form. Screw extruders or mills are commonly used for melt blending polymers. It will also be appreciated the blend of polymers may be a simple powder blend providing that the blend is subjected to a homogenizing process before or during the process of fabricating the ferroelectric material of the present invention. Thus, for example, where a ferroelectric material is formed from at least two polymers in a screw-fed injection-molding machine, the feed to the hopper of the screw may be a simple mixture of the two polymers since a blend may be achieved in the screw portion of the machine.

The term "polymer" includes oligomers (e.g., a polymer having 2 to 10 monomeric units or 2 to 5 monomeric units) and polymers (e.g., a polymer having greater than 10 monomeric units).

The term "about" or "approximately" are defined as being close to as understood by one of ordinary skill in the art, and in one non-limiting embodiment the terms are defined to be within 10%, preferably within 5%, more preferably within 1%, and most preferably within 0.5%.

The term "substantially" and its variations are defined as being largely but not necessarily wholly what is specified as understood by one of ordinary skill in the art, and in one non-limiting embodiment substantially refers to ranges within 10%, within 5%, within 1%, or within 0.5%.

The terms "inhibiting" or "reducing" or "preventing" or "avoiding" or any variation of these terms, when used in the claims and/or the specification includes any measurable decrease or complete inhibition to achieve a desired result.

The term "effective," as that term is used in the specification and/or claims, means adequate to accomplish a desired, expected, or intended result.

The use of the word "a" or "an" when used in conjunction with the term "comprising" in the claims or the specification may mean "one," but it is also consistent with the meaning of "one or more," "at least one," and "one or more than one."

The words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The ferroelectric devices of the present invention can "comprise," "consist essentially of," or "consist of" particular ingredients, components, compositions, etc. disclosed throughout the specification. With respect to the transitional phase "consisting essentially of," in one non-limiting aspect, a basic and novel characteristic of the ferroelectric device is that the ferroelectric device has a ferroelectric layer that has undergone a temperature cycle such that the ferroelectric material has ferroelectric hysteresis properties and is densified to promote stable operation under applied voltage.

Other objects, features and advantages of the present invention will become apparent from the following figures, detailed description, and examples. It should be understood, however, that the figures, detailed description, and examples, while indicating specific embodiments of the invention, are given by way of illustration only and are not meant to be limiting. Additionally, it is contemplated that changes and modifications within the spirit and scope of the invention will become apparent to those skilled in the art from this detailed description. In further aspects, features from specific aspects may be combined with features from other aspects. For example, features from one aspect may be combined with features from any of the other aspects.

BRIEF DESCRIPTION OF THE DRAWINGS

FIGS. 14A-14D depict polarization versus electric filed curves of ferroelectric devices made using the process of the present invention, measured at 1 kHz, 100 Hz, 10 Hz and 1 Hz.

FIGS. 15A-15C are scanning electron microscope images (with a magnified insert) of the ferroelectric device taken after the first and second steps of the temperature processes of the present invention.

FIG. 16 are FTIR spectra of the PVDF film taken at 1 minute and 70 minutes during the second step of the annealing process.

DETAILED DESCRIPTION OF THE INVENTION

The present invention concerns a process that allows for the efficient production of ferroelectric devices. In particular, the process utilizes a specific temperature cycle after the ferroelectric device is assembled but prior to annealing of the ferroelectric layer. One of the temperature cycles transforms ferroelectric material (e.g., an organic PVDF-based polymer) that does not exhibit ferroelectric hysteresis properties to a ferroelectric material that exhibits ferroelectric hysteresis properties. A subsequent temperature cycle densifies the ferroelectric material to remove or reduce interfacial cracks or voids in the surface of the material. The produced ferroelectric device exhibits polarization versus electric filed that is measureable up to as low as 1 Hz.

These and other non-limiting aspects of the present invention are discussed in further detail in the following sections.

A. Ferroelectric Device

Figure 1A:
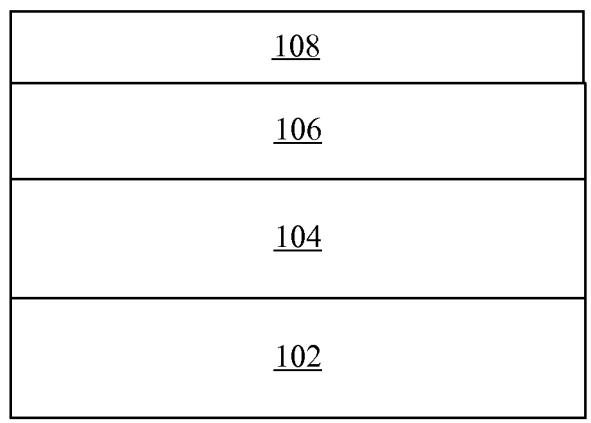
FIG. 1A is a 2-D cross-sectional view of a ferroelectric device that can be controlled through the processes and apparatuses of the present invention.
Figure 1B:
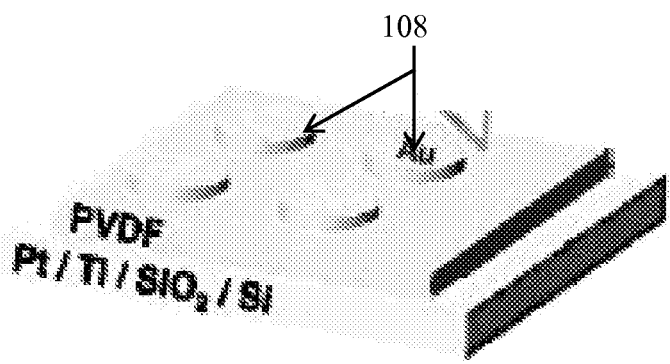
FIG. 1B is a perspective view of an array of a ferroelectric devices that may be used to store information according to the processes and apparatuses of the present invention.
Figure 2A:
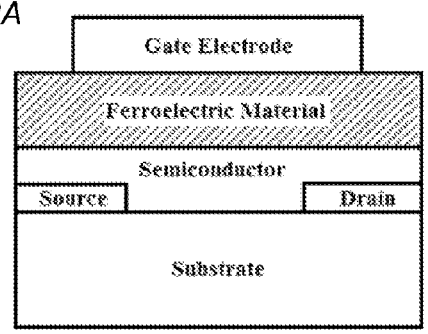
FIGS. 2A to 2D are schematics of four configurations for of various ferroelectric thin film transistors that can be controlled through the processes and apparatuses of the present invention.
Figure 2B:
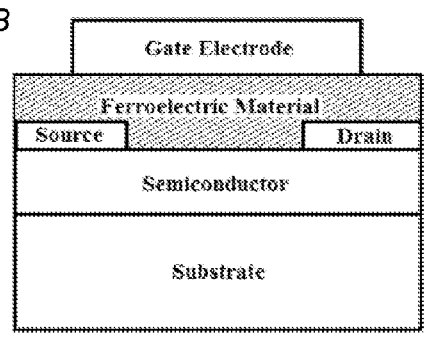
Figure 2C:
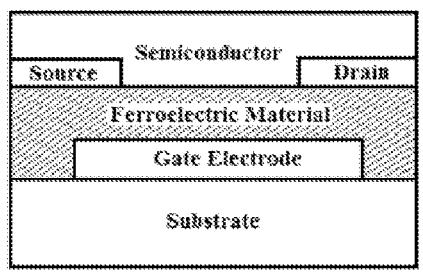
Figure 2D:
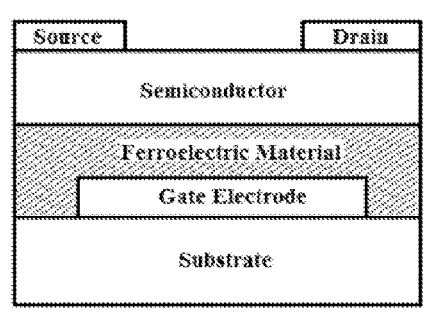

FIGS. 1A, 1B and 2 each provide a view of ferroelectric components of ferroelectric devices. These devices can be integrated into a memory device and operated by a memory controller or other device according to the methods of the present invention. A 2-D cross-sectional view of a ferroelectric device 100 of the present invention is depicted in FIG. 1A. Ferroelectric device 100 can be a thin film capacitor, a thin film transistor, or a thin film diode. In some aspects of the invention, the ferroelectric device is used in pyroelectric applications and piezoelectric applications. The ferroelectric device 100 can include a substrate 102, a bottom electrode 104, a ferroelectric material 106, and a top electrode 108. Although shown as sharing the ferroelectric material 106 and the bottom electrode 104, the ferroelectric layer 106 and the bottom electrode 104 may be patterned to form wholly separate structures. The ferroelectric device 100 can be fabricated on the substrate 102 by forming the ferroelectric material 106 between the conducting electrodes 104 and 108. For the purpose of FIG. 1, the ferroelectric material 106 is in the form of a film or layer. Additional materials, layers, and coatings (not shown) known to those of ordinary skill in the art can be used with the ferroelectric device 100, some of which are described below. An array of ferroelectric components may be manufactured by patterning, for example, the top electrodes 108 as shown in FIG. 1B. Other ferroelectric components that may be used to form memory arrays may be ferroelectric transistors (FeFETs), such as shown in FIG. 2. FIGS. 2A through 2D represent various field effect transistors with varying configurations depicted of thin film transistors 200 that can be integrated into a memory device.

The ferroelectric devices of the present invention, for example, those depicted in FIGS. 1 and 2 are said to have "memory" because, at zero applied volts, they have two remnant polarization states that do not decay back to zero. These polarization states can be used to represent a stored value, such as binary 0 or 1, and are read by applying a sense voltage between the electrodes 104 and 108 and measuring a current that flows between the electrodes 104 and 108. The amount of charge needed to flip the polarization state to the opposite state can be measured and the previous polarization state is revealed. This means that the read operation changes the polarization state, and can be followed by a corresponding write operation, in order to write back the stored value by again altering the polarization state.

1. Substrate

The substrate 102 can be used as a support. The substrate 102 can be made from material that is not easily altered or degraded by heat or organic solvents. Non-limiting examples of such materials include inorganic materials such as silicon, plastic, paper, banknotes substrates, which include polyethylene terephthalate, polycarbonates, polyetherimide, poly(methyl methacrylate), polyetherimides, or polymeric blends comprising such polymers. The substrate can be flexible or inflexible. The ferroelectric devices described herein may be produced on all types of substrates, including those that have low glass transition temperatures ($T_g$) (e.g., polyethylene terephthalate (PET), polyethylene (PE), polyvinyl chloride (PVC), polystyrene (PS), or polypropylene (PP)).

2. Top and Bottom Electrodes

The bottom electrode 104 can be made of a conductive material. Typically, the bottom electrode 104 can be obtained by forming a film using such a material (for example, vacuum deposition, sputtering, ion-plating, plating, coating, etc.). Non-limiting examples of conductive material that can be used to form a film include gold, platinum, silver, aluminum and copper, iridium, iridium oxide, and the like. In addition, non-limiting examples of conductive polymer materials include conducting polymers (such as PEDOT: PSS, polyaniline, graphene etc.), and polymers made conductive by inclusion of conductive micro-or nano-structures (such as silver nanowires). The thickness of the film for the bottom electrode 104 is typically between 20 nm to 500 nm, although other sizes and ranges are contemplated for use in the context of the present invention.

The material used for the top electrode 108 can be conductive. Non-limiting examples of such materials include metals, metal oxides, and conductive polymers (e.g., polyaniline, polythiophene, etc.) and polymers made conductive by inclusion of conductive micro-or nano-structures. In addition, non-limiting examples of conductive polymer materials include conducting polymers (such as PEDOT: PSS, Polyaniline, graphene etc.), and polymers made conductive by inclusion of conductive micro-or nano-structures (such as gold nanowires). The top electrode 108 can be a single layer or laminated layers formed of materials each having a different work function. Further, it may be an alloy of one or more of the materials having a low work function and at least one selected from the group consisting of gold, silver, platinum, copper, manganese, titanium, cobalt, nickel, tungsten, and tin. Examples of the alloy include a lithium-aluminum alloy, a lithium-magnesium alloy, a lithium-indium alloy, a magnesium-silver alloy, a magnesium-indium alloy, a magnesium-aluminum alloy, an indium-silver alloy, and a calcium-aluminum alloy. The film thickness of the top electrode 108 is typically between 20 nm to 500 nm, or 50 nm to 100 nm. In some embodiments, the top electrode 108 is deposited on ferroelectric material 106 spray coating, ultrasonic spray coating, roll-to-roll coating, ink jet printing, screen printing, drop casting, spin coating, dip coating, Mayer rod coating, gravure coating, slot die coating, doctor blade coating, extrusion coating, or any combination thereof.

3. Ferroelectric Material

The ferroelectric material 106 can be interposed between the bottom electrode 104 and the top electrode 108. In one instance, the ferroelectric material 106 can be obtained from a blend of a ferroelectric polymer and a polymer having a low dielectric constant, wherein the polymers have been solubilized in the same solvent or solvent system. In one instance, the ferroelectric material 106 can be obtained from a ferroelectric precursor material (See, FIG. 3A, element 302), which can include a ferroelectric polymer, copolymer, terpolymer, or a polymer blend comprising a ferroelectric polymer, copolymer, or terpolymer or combinations thereof. In preferred aspects, the polymers in the precursor material 302 are solubilized in a solvent or melt such that they do not exhibit ferroelectric hysteresis properties, but can be transformed via annealing by, for example, a two-step temperature treatment to exhibit ferroelectric hysteresis properties. A discussion on this process is provided below. Non-limiting examples of ferroelectric polymers include PVDF-based polymers, polyundecanoamide (Nylon 11)-based polymers, or blends of PVDF-based polymers or polyundecanoamide (Nylon 11)-based polymers. The PVDF-based polymer can be a homopolymer, a copolymer, or a terpolymer, or a blend thereof. A non-limiting example of a PVDF-based homopolymer polymer is PVDF. Non-limiting examples of PVDF-based copolymers are poly(vinylidene fluoride-tetrafluoroethylene) (PVDF-TrFE), poly(vinylidene-fluoride-co-hexafluoropropene) (PVDF-HFP), poly(vinylidene-fluoride-chlorotrifluoroethylene) (PVDF-CTFE) or poly(vinylidene-fluoride-chlorofluoroethylene) (PVDF-CFE). Non-limiting examples of PVDF-based terpolymers include poly(vinylidene-fluoride-trifluoroethylene-chlorotrifluoroethylene) (PVDF-TrFE-CTFE) or poly(vinylidene-fluoride-trifluoroethylene-chlorofluoroethylene) (PVDF-TrFE-CFE). The ferroelectric polymer can be blended with a non-ferroelectric polymer. Examples of non-ferroelectric polymers include a poly(phenylene oxide) (PPO), a polystyrene (PS), or a poly(methyl methacrylate) (PMMA), or blends thereof. In preferred aspects, the polymers in the precursor material are solubilized in a solvent or melt such that they do not exhibit ferroelectric hysteresis properties but can be deposited on the bottom 102, and then transformed via annealing by, for example the two-two heat treatment described throughout the specification, to exhibit ferroelectric hysteresis properties.

B. Method of Producing Ferroelectric Devices

Figure 3A:
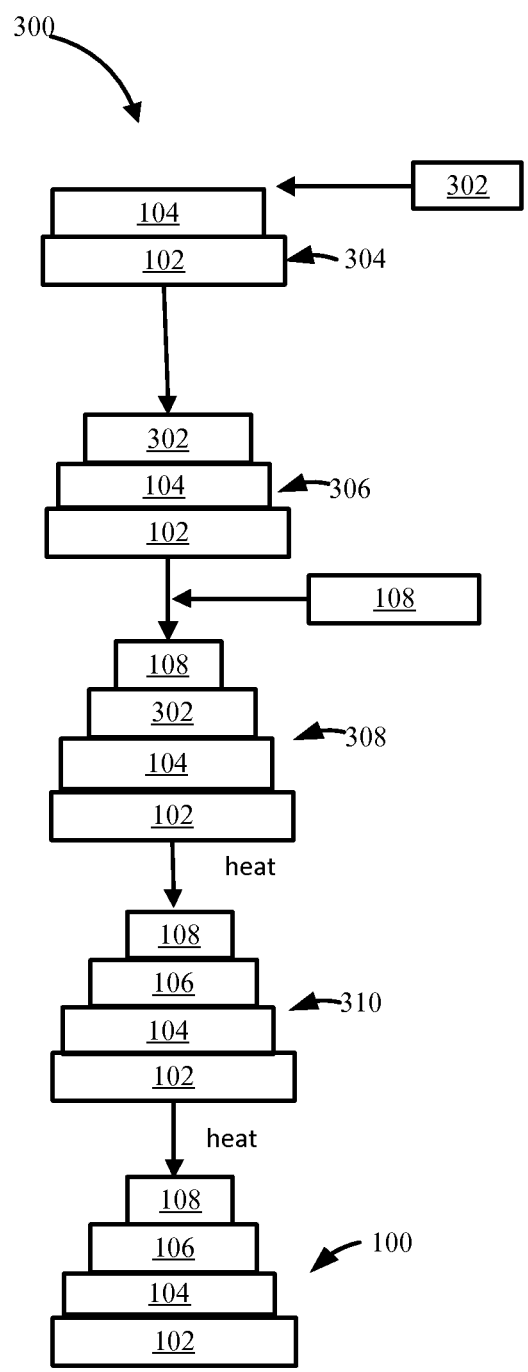
FIG. 3A is a schematic of a process to prepare the ferroelectric devices of the present invention using a two-step annealing process.

Referring to FIG. 3A, the precursor ferroelectric material 302 can be deposited on the bottom electrode 104 via spin-coating, spray coating, ultrasonic spray coating, roll-to-roll coating, ink jet printing, screen printing, drop casting, dip coating, Mayer rod coating, gravure coating, slot die coating, doctor blade coating, extrusion coating, flexography, gravure, offset, rotary screen, flat screen, ink-jet, laser ablation, or any combination thereof. A non-limiting example includes solubilizing a ferroelectric precursor material in a polar solvent to form a thin film. The thin film can be applied to the center of the bottom electrode 104 on stack 304 (substrate 102 and bottom electrode 104) such that the precursor material 302 is spread thinly over the bottom electrode 104 to form stack 306. Stack 306 includes substrate 102, bottom electrode 104, and precursor material 302.

The top electrode 108 can be disposed on the precursor material 302 by, for example, thermal evaporation through a shadow mask to form stack 308. Stack 308 includes substrate 102, bottom electrode 104, and precursor material 302, and top electrode 108. The film thickness of the top electrode 108 is typically between 20 nm to 500 nm, or 50 nm to 100 nm. In some embodiments, the top electrode 108 is deposited on precursor material 302 using spray coating, ultrasonic spray coating, roll-to-roll coating, ink jet printing, screen printing, drop casting, spin coating, dip coating, Mayer rod coating, gravure coating, slot die coating, doctor blade coating, extrusion coating, or any combination thereof.

Figure 3B:
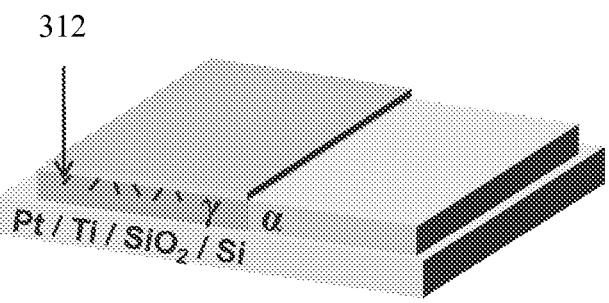
FIG. 3B is a perspective view of a ferroelectric device after the first step of the two-step annealing processes.
Figure 3C:
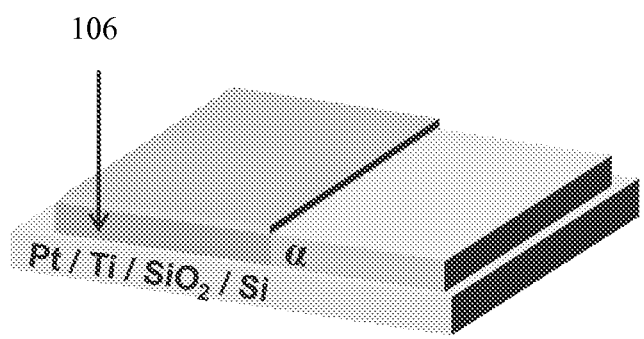
FIG. 3C is a perspective view of a ferroelectric device of the present invention after the second step of the two-step annealing processes.
Figure 4:
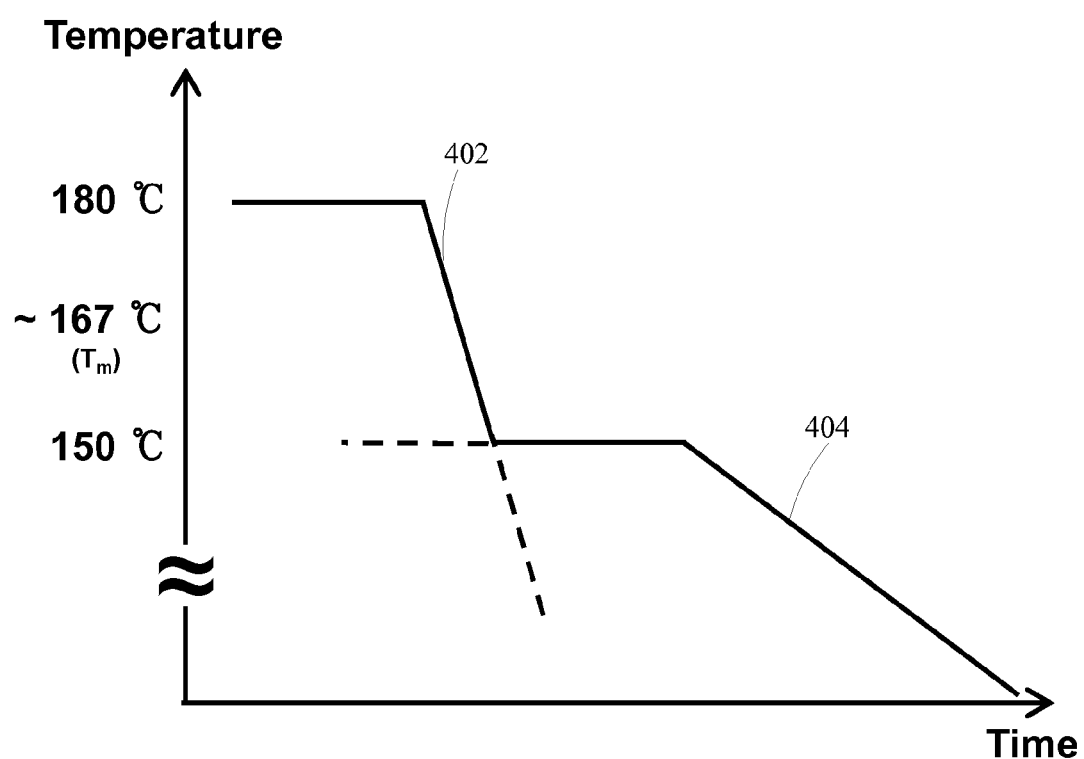
FIG. 4 is a graphical depiction of time versus temperature for the annealing process of the ferroelectric device of the invention.

The stack 308 can be heat treated at a temperature from 167° C. to 200° C. or 175° C., 180, ° C. or 185° C. or any range there between for about 1 to 60, 10 to 50, or 20 to 30 minutes. Heat treating the stack 308 to above 167° C., but below 200° C. transforms the precursor ferroelectric material 302 to the ferroelectric material 106 having ferroelectric hysteresis properties to form stack 310. In some embodiments, the stack can be heated to 167° C., 168° C., 169° C., 170° C., 171° C., 172° C., 173° C., 174° C. 175° C., 176° C., 178° C., 179° C., 180° C., 181° C., 182° C., 183° C., 184° C., 185° C., 186° C., 188° C., 189° C., 180° C., 191° C., 192° C., 193° C., 194° C., 195° C., 196° C., 198° C., or 199° C. Without wishing to be bound by theory, it is believed that interfacial crack(s) 312 (shown in FIG. 3B) exists between ferroelectric material 106 and bottom electrode 104 after the first step in the annealing process. The presence of interfacial crack 312 can be detrimental to the performance of operation of the ferroelectric device under applied voltage (for example, the ferroelectric device may demonstrate large leakage current). Stack 310 can be subjected (for example, cooled) to a temperature of less than 167° C. and above about 100° C., for example, to a temperature of 145° C. to 155° C. and held for about 10 to 70, or 20 to 60, or 30 to 50 minutes to densify the ferroelectric material 106 and form ferroelectric device 100. Without wishing to be bound by theory, it is believed that subjecting the stack 310 over time to the second temperature range between 100 and 167° C. densifies the ferroelectric material and seals or substantially seals crack 312. FIG. 3C is a perspective view the ferroelectric device 100 after the second step of the annealing process depicting the absence of interfacial fractures 312. As shown in FIG. 3C, layer 106 is absent or substantially absent of fractures. FIG. 4 is a graphical depiction of time versus temperature for the two-step heat-treating process. Line 402 depicts the phase transformation curve of the alpha phase of a PVDF polymer transformation to the gamma phase of the ferroelectric polymer, which has ferroelectric hysteresis properties. Line 404 depicts the densification temperature profile for the ferroelectric polymer after phase transformation to the gamma phase. The gamma phase of the PVDF polymer is maintained during the second step of the heating process, which densifies the PVDF polymer film.

In some aspects of the invention, ferroelectric device 100 can be made using a roll-to-roll process. The substrate 102 can be obtained from a coiled roll. The substrate 102 can be unrolled and placed on a first roller and then attached to a second roller such that the substrate 102 moves from the first roller to the second roller. Along the path, various apparatuses for deposition of various materials can be included. For instance, a bottom electrode 104 can be disposed onto the substrate 102 via any forms of deposition methods discussed above. If needed, the bottom electrode 104 can be further processed (e.g., curing of the deposited bottom electrode 104. After the bottom electrode 104 is deposited and processed onto the substrate 102, the precursor material 302 can be disposed onto at least a portion of the surface of the bottom electrode 104 (stack 306). The top front electrode 108 can be deposited onto at least a surface of the precursor material 302 via another deposition device as stack 306 is moved at a desired speed. The stack 306 directly rolled to a device that produces heat such as standard rapid thermal annealing ovens. The heating device can be used in combination with software to specifically control duration of heating and temperature of heating. The stack 306 can be heated at a first temperature above a melting temperature of the precursor material to form an organic polymeric ferroelectric material having ferroelectric hysteresis properties to form stack 308. Stack 308 can be rolled to a second heating device and heated to a second temperature below a melting temperature of the organic polymeric ferroelectric material to densify the organic polymeric ferroelectric material and to obtain a thin film ferroelectric device. The roll-to roll process can be performed at a rate of 100 $m^2$/s or less, 90 $m^2$/s or less, 80 $m^2$/s or less, or 50 $m^2$/s or less.

C. Applications for Ferroelectric Devices

Any one of the ferroelectric devices of the present invention can be used in a wide array of technologies and devices including but not limited to: smartcards, RFID cards/tags, piezoelectric sensors, piezoelectric transducers, piezoelectric actuators, pyroelectric sensors, memory devices, non-volatile memory, standalone memory, firmware, microcontrollers, gyroscopes, acoustics sensors, actuators, microgenerators, power supply circuits, circuit coupling and decoupling, radio frequency filtering, delay circuits, radio frequency tuners, passive infra-red sensors ("people detectors"), infrared imaging arrays and fingerprint sensors. If implemented in memory, including firmware, functions may be stored in the ferroelectric device as one or more instructions or code on a computer-readable medium. Examples include computer-readable media encoded with a data structure and computer-readable media encoded with a computer program. Computer-readable media includes physical computer storage media. Combinations of the above should also be included within the scope of computer-readable media.

In many of these applications thin films of ferroelectric materials are typically used, as this allows the field required to switch the polarization to be achieved with a moderate voltage. Although some specific circuitry has been set forth, it will be appreciated by those skilled in the art that not all of the disclosed circuitry is required to practice the disclosure. Moreover, certain well known circuits have not been described, to maintain focus on the disclosure.

Figure 5:
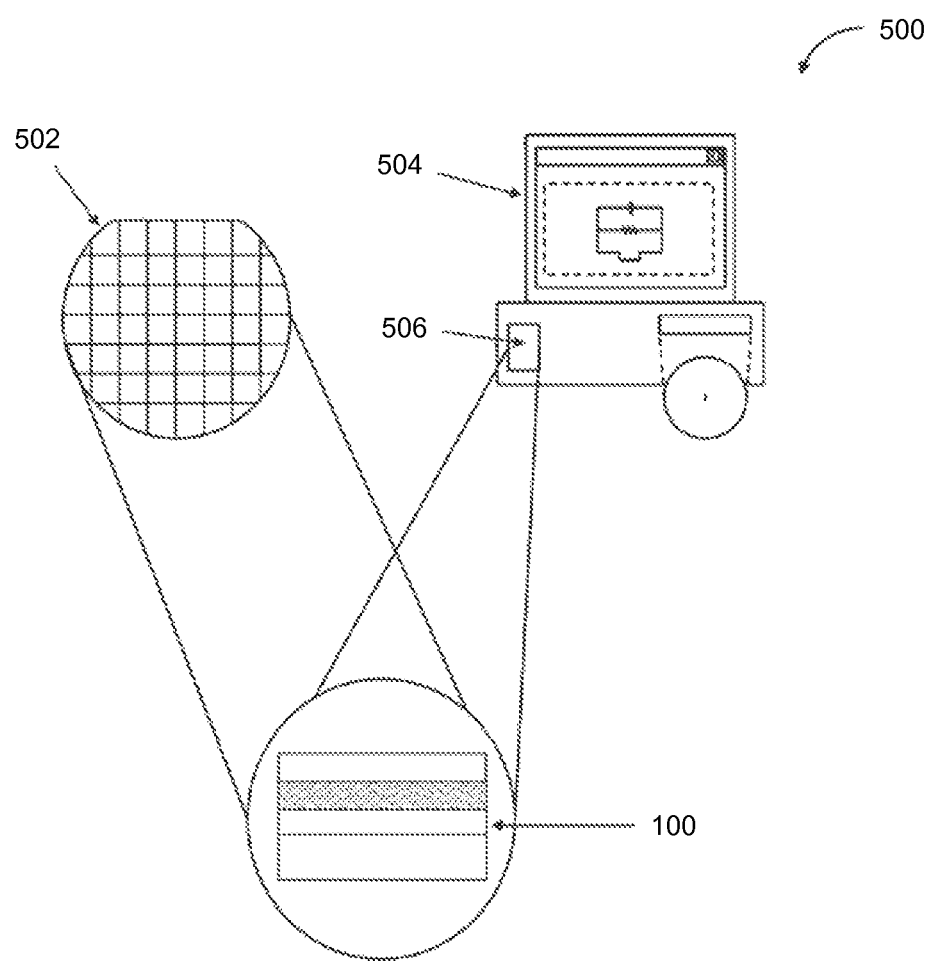
FIG. 5 is a schematic of implementation of a circuit in a semiconductor wafer or an electronic device using ferroelectric devices of the present invention.

FIG. 5 is schematic depicting implementation of an integrated circuit in a semiconductor wafer or an electronic device according to one embodiment. In one case, a ferroelectric device 100 (for example, as a capacitor, transistor, or a diode) may be found in a wafer 502. The wafer 502 may be singulated into one or more dies that may contain the ferroelectric device 100. Additionally, the wafer 502 may experience further semiconductor manufacturing before singulation. For example, the wafer 502 may be bonded to a carrier wafer, a packaging bulk region, a second wafer, or transferred to another fabrication facility. Alternatively, an electronic device 504 such as, for example, a personal computer, may include a memory device 506 that includes the ferroelectric device 100. Additionally, other parts of the electronic device 504 may include the ferroelectric device 100 such as a central processing unit (CPU), a digital-to-analog converter (DAC), an analog-to-digital converter (ADC), a graphics processing unit (GPU), a microcontroller, or a communications controller.

Figure 6:
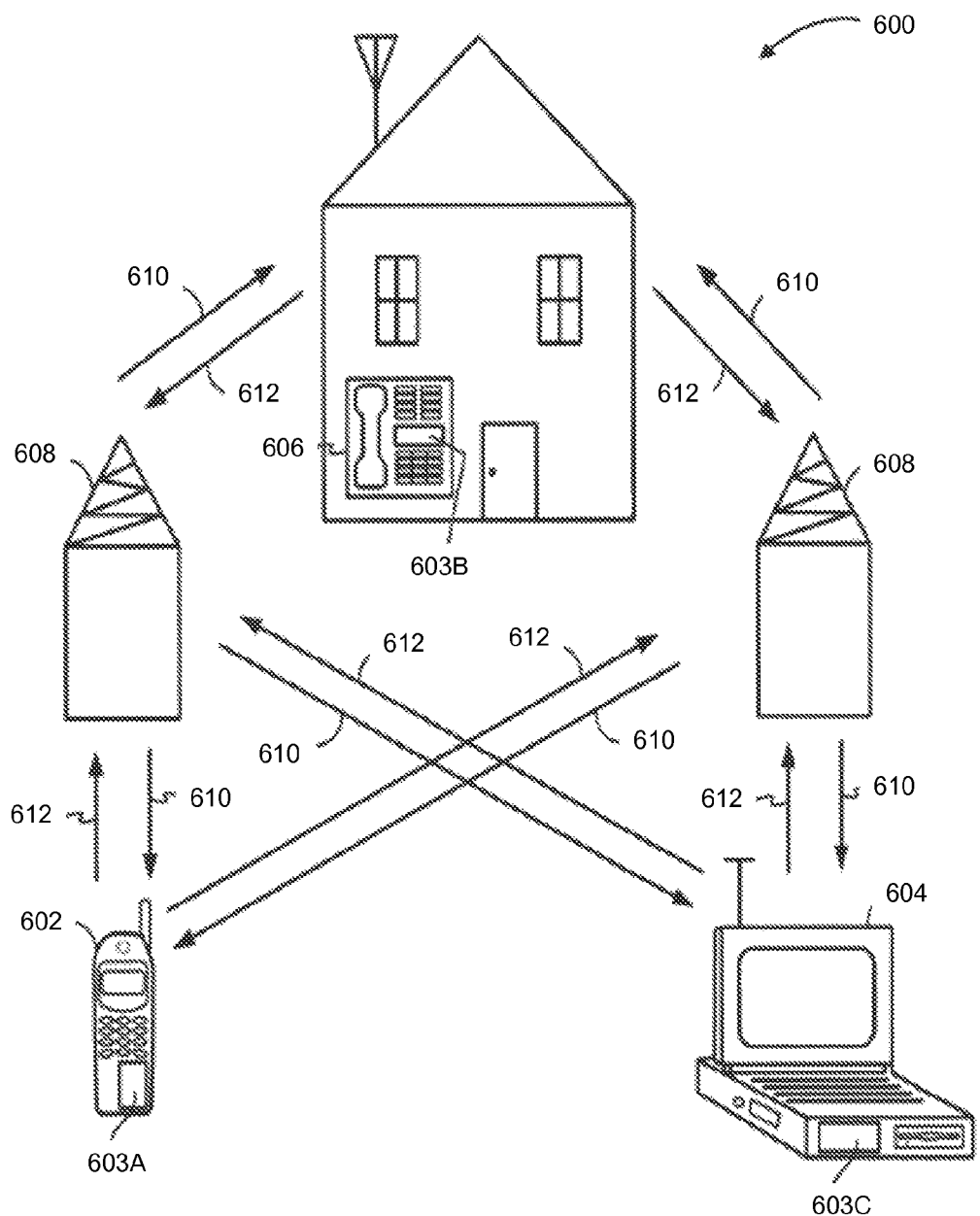
FIG. 6 is a schematic of implementation of an exemplary wireless communication system in which ferroelectric devices of the present invention may be advantageously employed.

FIG. 6 is a block diagram showing an exemplary wireless communication system 600 in which an embodiment of the disclosure may be advantageously employed. For purposes of illustration, FIG. 6 shows three remote units 602, 604, and 606 and two base stations 608. It will be recognized that wireless communication systems may have many more remote units and base stations. Remote units 602, 604, and 606 include circuit devices 603A, 603C and 603B, which may include integrated circuits or printable circuit boards that include the disclosed ferroelectric device, for example, a ferroelectric device made by the processes of the present invention. It will be recognized that any device containing an integrated circuit or printable circuit board may also include the ferroelectric devices disclosed herein, including the base stations, switching devices, and network equipment. FIG. 6 shows forward link signals 610 from the base station 608 to the remote units 602, 604, and 606 and reverse link signals 612 from the remote units 602, 604, and 606 to base stations 608.

The remote unit 602 is shown as a mobile telephone, the remote unit 606 is shown as a portable computer, and the remote unit 604 is shown as a fixed location remote unit in a wireless local loop system. For example, the remote units may be mobile phones, hand-held personal communication systems (PCS) units, portable data units such as personal data assistants, GPS enabled devices, navigation devices, set upper boxes, music players, video players, entertainment units, fixed location data units such as meter reading equipment, tablets, or any other device that stores or retrieves data or computer instructions, or any combination thereof. Although FIG. 6 illustrates remote units according to the teachings of the disclosure, the disclosure is not limited to these exemplary illustrated units. Embodiments of the disclosure may be suitably employed in any device which includes the ferroelectric device 100 made by the processes disclosed by the present invention.

Ferroelectric components, such as the ferroelectric devices described throughout this application, may be operated as memory cells to store data, such as information, code, or instructions. For example, a single ferroelectric capacitor may store a single bit of information, e.g., '1' or '0.' This '1' or '0' value may be stored as a binary polarization direction of the ferroelectric layer in the ferroelectric component. For example, when the ferroelectric layer is polarized from top to bottom, the ferroelectric component stores a '1', and when the ferroelectric layer is polarized from bottom to top, the ferroelectric component stores a '0.' This mapping of polarization states is only one example. Different polarization levels may be used to represent the '1' and '0' data bits in different embodiments of the present invention.

D. Operation of a Controller for a Ferroelectric Memory Device for Storing Multiple Bits of Information in Memory Cells of the Ferroelectric Memory Device A ferroelectric memory device may be constructed with an array of ferroelectric memory devices described above, in which each device comprises a ferroelectric memory cell. Read and write operations to the ferroelectric memory device may be controlled by a memory controller coupled to the array of multi-level ferroelectric memory cells. One example of a write operation performed by the controller to store information in a single ferroelectric memory cell is described below. A method may include receiving a bit and an address for writing to the addressed ferroelectric memory cell. The bit may be, for example '0' or '1.' Then, a write pulse of a predetermined voltage may be applied across the top and bottom electrodes of the memory cell. The write pulse may create a certain level of remnant polarization in the ferroelectric layer of the ferroelectric memory cell. That remnant polarization affects characteristics of the ferroelectric memory cell, which may be measured at a later time to retrieve the bit that was stored in the ferroelectric memory cell. The cell programming may also include other variations in the write pulse. For example, the controller may generate multiple write pulses to apply to the memory cell to obtain the desired remnant polarization in the ferroelectric layer. In some embodiments, the controller may be configured to follow a write operation with a verify operation. The verify operation may be performed with select write operations, all write operations, or no write operations. The controller may also execute a read operation to obtain the bit stored in the ferroelectric memory cell.

In an array of ferroelectric memory cells, the array may be interconnected by word lines extending across rows of memory cells and bit lines extending across columns of memory cells. The memory controller may operate the word lines and bit lines to select particular memory cells from the array for performing read and/or write operations according to address received from a processor or other component requesting data from the memory array. Appropriate signals may then be applied to the word lines and bit lines to perform the desired read and/or write operation.

E. Operation as a Decoupling Capacitor and as an Energy Storage Device

Figure 7:
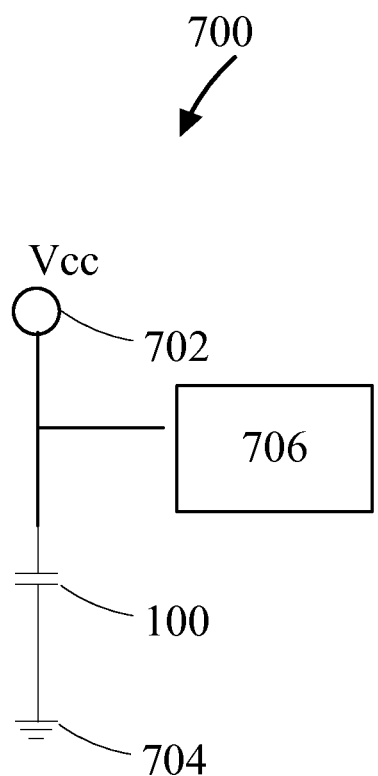
FIG. 7 is a schematic of an electronic circuit that includes the ferroelectric device of the present invention.
Figure 8:
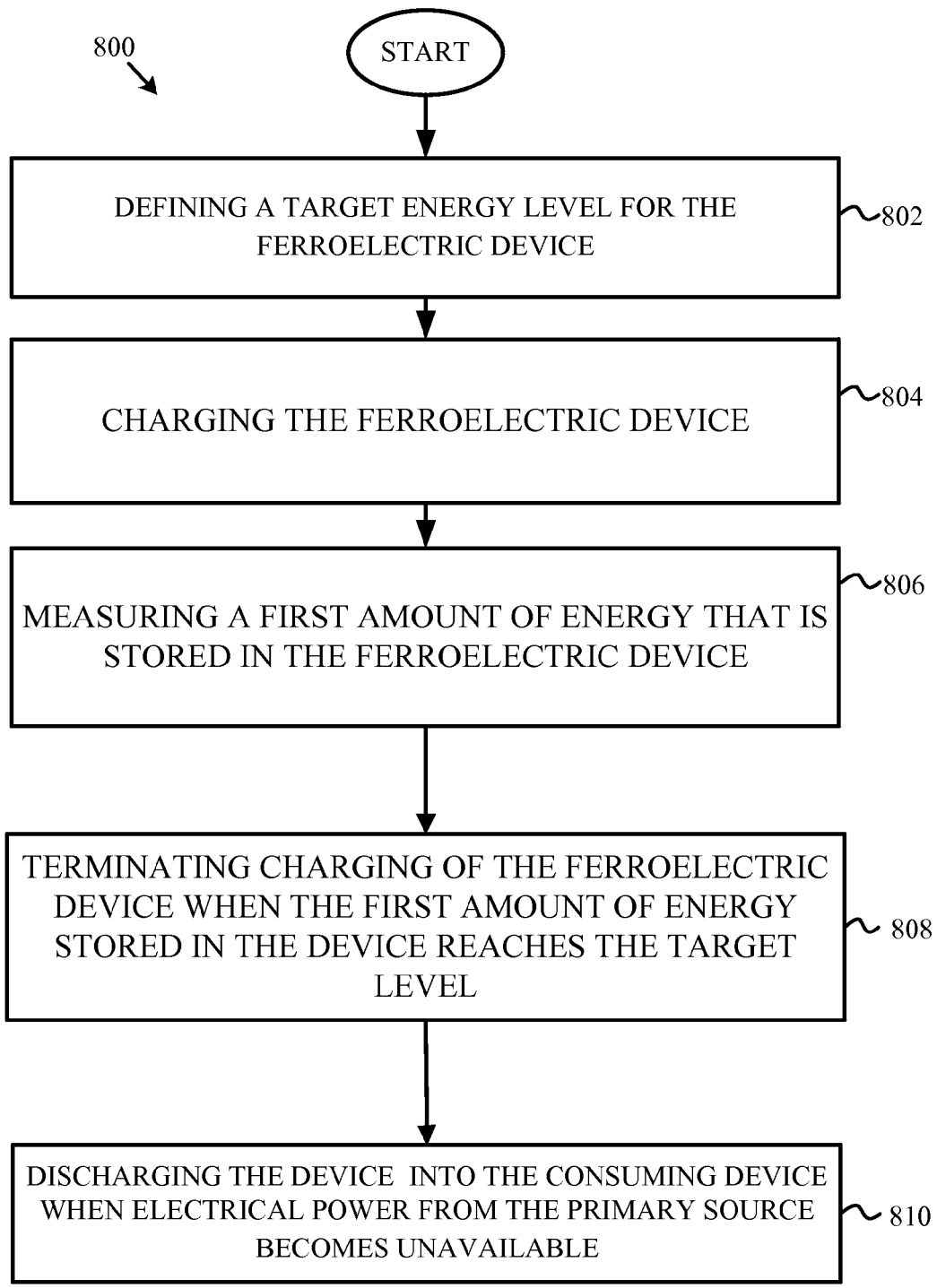
FIG. 8 is a flowchart of a method for operating an energy storage circuit that includes ferroelectric device of the present invention.

The ferroelectric device, for example, a ferroelectric capacitor, of the present invention can be used to decouple one part of an electrical network (circuit) from another. FIG. 7 is a schematic of circuit 700 that includes the ferroelectric device 100 as a ferroelectric capacitor. Ferroelectric capacitor 100 is coupled to power voltage line 702 and a ground voltage line 704. Power noise generated by the power voltage and the ground voltage is shunted through the capacitor, and thus reducing the overall power noise in the circuit 706. The ferroelectric capacitor 100 can provide local energy storage for the device by providing releasing charge to the circuit when the voltage in the line drops. FIG. 8 is a flowchart of a method for operating an energy storage circuit that includes ferroelectric device 100. The ferroelectric device 100 can provide electrical power to a consuming device when electrical power from a primary source is unavailable. Method 800 of FIG. 8 begins at block 802 with defining a target energy level for the ferroelectric device. The target energy level may be, for example, 0.1 µF to 10 µF, for a ferroelectric capacitor of the present invention. After the target energy level is defined, at block 804 the ferroelectric device 100 is charged to the defined energy level. At block 806, a first amount of energy that is stored in the ferroelectric device 100 is measured. When the first amount of energy stored in the ferroelectric device 100 reaches the target energy level, the charging is terminated at block 808. At block 810, when electrical power becomes unavailable from the primary source (for example, a voltage source), the ferroelectric device 100 will discharge energy into the consuming device (for example, a smart phone, computer, or tablet).

Figure 9:
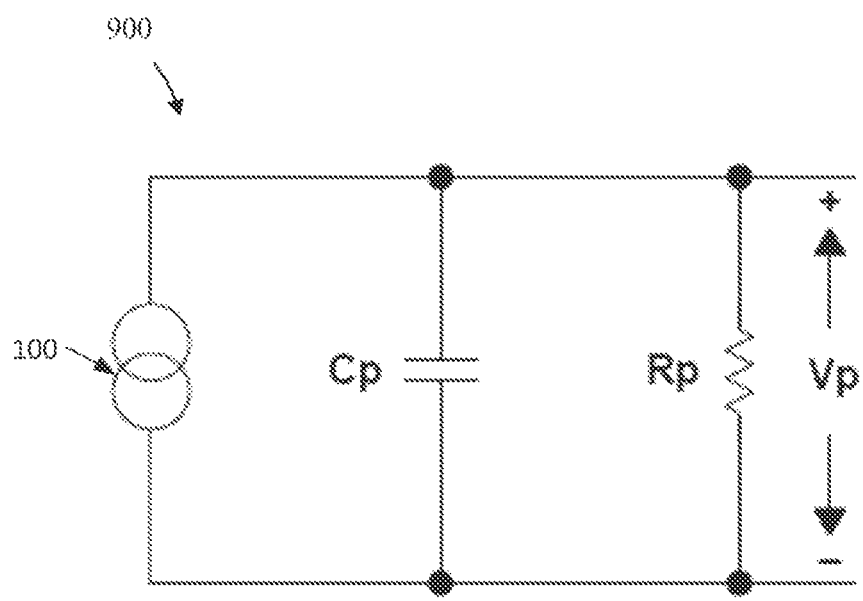
FIG. 9 is a schematic of a piezoelectric sensor circuit using the ferroelectric device of the present invention.
Figure 10:
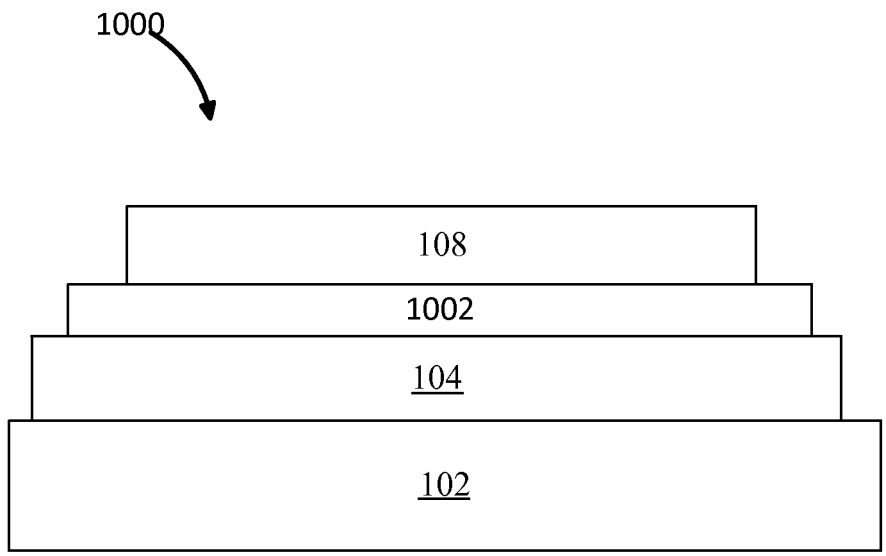
FIG. 10 is a 2-D cross-sectional representation of the ferroelectric device of the present invention with a piezoelectric layer.
Figure 11:
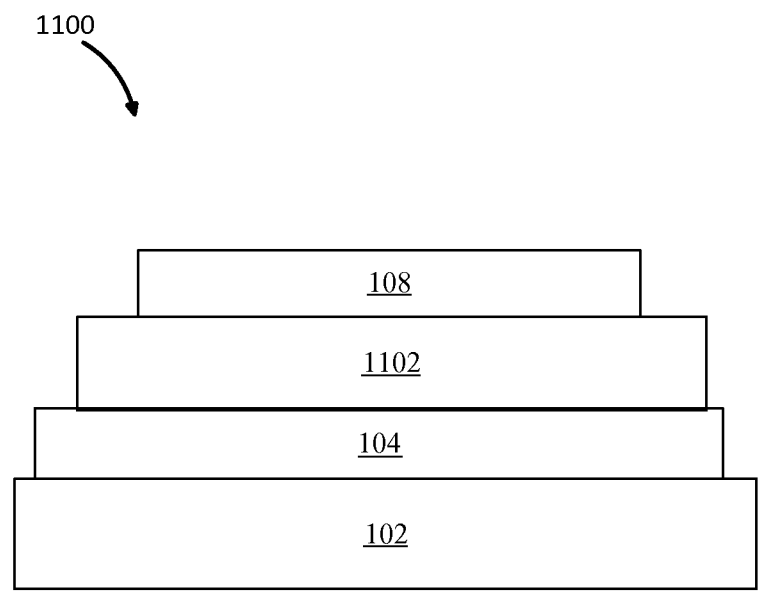
FIG. 11 is a 2-D cross-sectional representation of the ferroelectric device of the present invention with pyroelectric material.

FIG. 9 is a schematic of a piezoelectric sensor circuit using the ferroelectric device 100 as a piezoelectric device in a circuit. When a piezoelectric sensor is at rest, the dipoles formed by the positive and negative ions cancel each other due to the symmetry of the polymer structure, and an electric field is not observed. When stressed, the polymer deforms, symmetry is lost, and a net dipole moment is created. The dipole moment creates an electric field across the polymer. The materials generate an electrical charge that is proportional to the pressure applied. As shown in FIG. 9, the piezoelectric sensor 900 includes a ferroelectric device 100 as the piezoelectric component of the sensor. It is also envisioned that the ferroelectric device 100 of the present invention can be used as the decoupling device (for example, a capacitor) in the same circuit. FIG. 10 is a 2-D cross-sectional representation of the ferroelectric device 100 in combination with the ferroelectric material 106 being used as a piezoelectric material. As shown in FIG. 10, ferroelectric device 1000 includes piezoelectric material 1002 made using the process described throughout this specification can be disposed between bottom electrode 104 and top electrode 108 in a piezoelectric device, and, when stressed create a net dipole moment. A method of using a ferroelectric device of the present invention as a piezoelectric device includes sending a vibrational pulse to the piezoelectric device; comparing the device voltage to a reference voltage and adjusting the vibration pulses in response to the comparison. FIG. 11 is a 2-D cross-sectional representation of the ferroelectric device 100 in combination with a pyroelectric material. As shown in FIG. 11, ferroelectric device 1100 includes pyroelectric material 1102 as made using the process described throughout this specification and having ferroelectric hysteresis properties can be disposed between bottom electrode 102 and top electrode 108 in a pyroelectric device, and will generate a charge when exposed to infrared light. A method of using a ferroelectric device of the present invention as a pyroelectric device includes sending heat pulse to the pyroelectric device; comparing the device voltage to a reference voltage and adjusting the heat pulses in response to the comparison.

EXAMPLES

The present invention will be described in greater detail by way of specific examples. The following examples are offered for illustrative purposes only, and are not intended to limit the invention in any manner. Those of skill in the art will readily recognize a variety of noncritical parameters which can be changed or modified to yield essentially the same results.

Example 1

Fabrication of Ferroelectric Device with 2-Step Temperature Process

A ferroelectric capacitor of the present invention was fabricated using a two-step temperature process using the following method.

Polymer Solution. A solution of PVDF in solvent was prepared by adding PVDF powder (Sigma Aldrich®, MW=534,000 g/mol) to dimethylformamide solvent (Sigma Aldrich®). The solution was filtered using a polytetrafluoroethylene filter (1 µm pore size). The PVDF solution was stirred and heated at 110° C. using a conventional hot-plate for about 20 min to completely dissolve the PVDF. This heating of the PVDF solution ensured that the spin-coated PVDF thin-films would be uniform.

Ferroelectric Capacitor. A bottom electrode (25 nm-thick Pt (25 nm)/Ti (5 nm)) was sputter deposited on $SiO_2$ (100 nm silicon). The bottom electrode and substrate was added to a spin coating apparatus. The hot polymer solution was deposited on the bottom electrode at a rate of 4000 rpm for 60 seconds to provide a 200 to 250 nm uniform PVDF thin-film on the electrode under a nitrogen atmosphere in a glove box. After spin-coating the PVDF thin film/electrode/substrate stack was baked on hot-plate (at 150° C., inside the glovebox) to render the thin-film solvent free. A 90 nm Au top-electrode was deposited on the PVDF thin-film by thermal evaporation through a shadow mask. For the initial 10 nm, Au was deposited using a 0.1 Å/s deposition rate, followed by a 1 Å/s rate for the remaining 80 nm. The Au/PVDF/Pt stack was then annealed at 180° C. on a conventional hot plate for about 10 to 60 min (hereafter referred to as the first step). Next the temperature was maintained at 150° C., which is below the melting point (167° C.) of PVDF for about 10 to 70 min (hereafter referred to as the second step) to form ferroelectric capacitors of the present invention.

Example 2

Testing of Ferroelectric Devices of Example 1

Figures 12A, 12B:
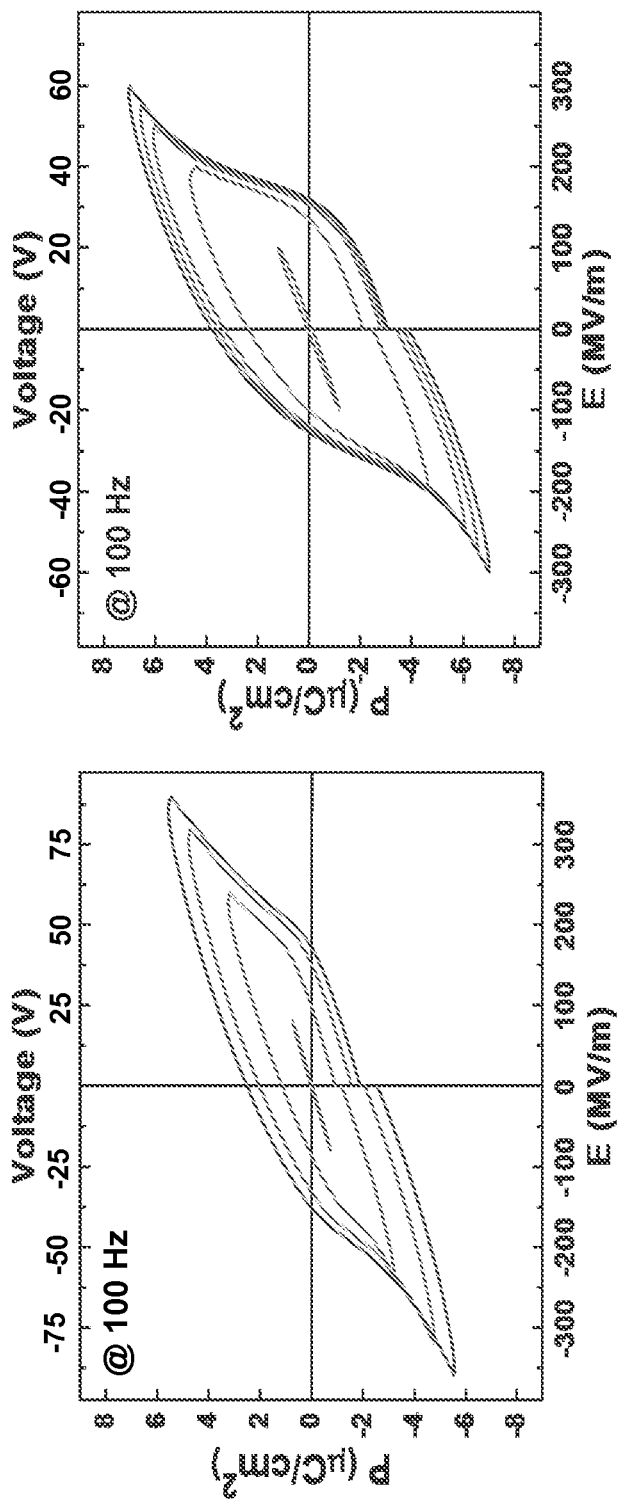
FIGS. 12A and 12B are graphs of the polarization ($\mu C/cm^2$) versus electric field (MV/m) at 100 Hz for a ferroelectric device of the present invention before and after the two-step temperature process.

Ferroelectric Hysteresis Properties During Annealing Process. Hysteresis loops for the ferroelectric devices of the present invention made in Example 1, were measured before and after the 2-step temperature process at a frequency of 100 Hz and are depicted in FIGS. 12A and 12B. FIG. 12A is a graphical depiction of the polarization ($\mu C/cm^2$) versus electric field (MV/m) at 100 Hz for a ferroelectric device of the present invention before starting the 2-step temperature process. FIG. 12B is a graphical depiction of the polarization ($\mu C/cm^2$) versus electric field (MV/m) at 100 Hz for a ferroelectric capacitor of the present invention after the two step temperature process. Comparing FIG. 12A to FIG. 12B, the hysteresis loop in FIG. 12B was more defined than for the hysteresis for the ferroelectric material in FIG. 12A, and thus demonstrating an improvement of the hysteresis properties of the ferroelectric material due to the two-step temperature process.

Figure 13A:
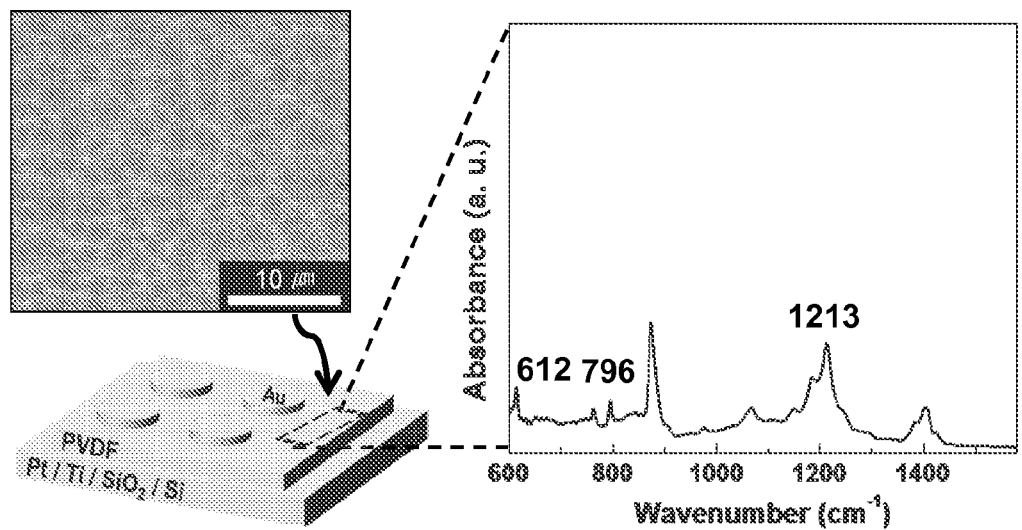
FIGS. 13A and 13B are scanning electron microscopy images and FTIR-spectra taken before and after the two-step temperature process of the present invention.
Figure 13B:
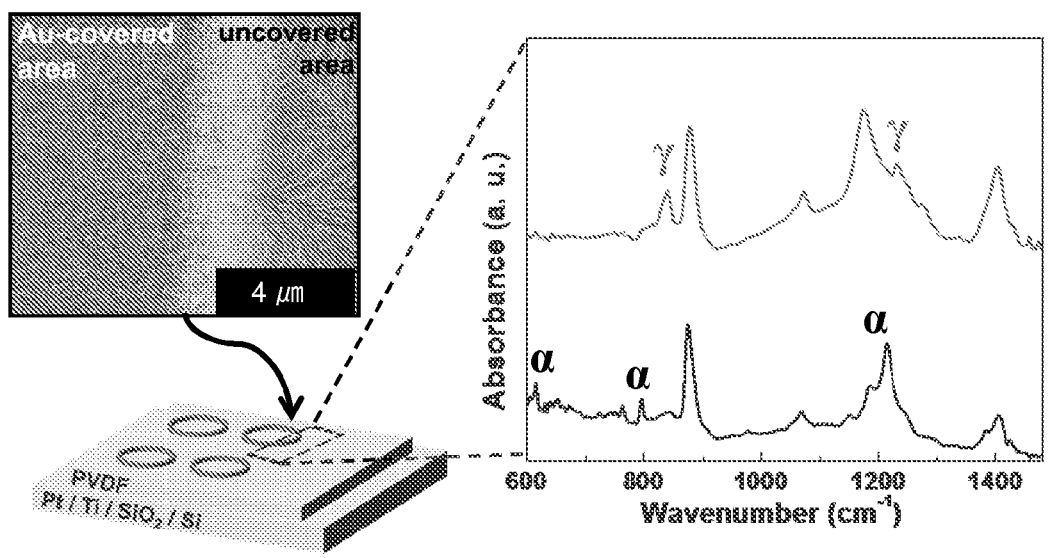

Scanning Electron Microscopy Properties. FIGS. 13A and 13B are scanning electron microscopy images and FTIR-spectra taken before and after the two-step temperature process. The data depicted in FIG. 13A was obtained prior to the two-step temperature processes. The data depicted in FIG. 13B was obtained after to the two-step temperature processes. Comparing the SEM data in FIG. 13A to the SEM data in FIG. 13B, the FIG. 13B device has a transformed PVDF polymer and a more homogenous, and therefore, a more densified ferroelectric layer.

Ferroelectric Hysteresis Properties at Various Frequencies. FIGS. 14A-D depict polarization versus electric filed curves of ferroelectric capacitors made using the process of the present invention, measured at 1 kHz, 100 Hz, 10 Hz and 1 Hz, respectively. As shown, in the hysteresis data, the ferroelectric capacitor demonstrates stable operation at low frequency (below 100 Hz).

Surface Morphology During Annealing Process. FIGS. 15A through 15C are scanning electron microscope images (with a magnified insert) of the ferroelectric capacitor of the present invention taken after the first step of the temperature process (FIG. 15A) and after heating the ferroelectric capacitor of FIG. 15A for 30 minutes (FIG. 15B) and after heating the ferroelectric capacitor 70 min at the lower temperature of the two-step temperature process (FIG. 15C). As shown in the images, the surface defects in FIG. 15C are reduced as compared to those in FIG. 15A. FIG. 16 are FTIR spectra of the device taken during the annealing process. Data 1502 is the FTIR spectra taken after heating at 150° C. for 1 minute and data 1504 is the FTIR spectra taken after heating at 150° C. for 70 minute. As shown in FIG. 16, the phase of the PVDF film did not change during the second step of the annealing process.

In sum, subjecting the assembled ferroelectric device to a two-step temperature process produces a durable device that is stable a low frequency as compared to conventional devices (See, for example, comparative devices made by Kang et al., *Applied Physics Letters,* 2008 using 1-step rapid annealing process at 150° C.).

The invention claimed is:
1. A method for producing a thin film ferroelectric device, the method comprising:
  (a) depositing an organic polymeric ferroelectric precursor material onto a first conductive material such that the organic polymeric ferroelectric precursor material has a first surface and an opposing second surface, wherein the first surface of the organic polymeric ferroelectric precursor material is in contact with the first conductive material;
  (b) depositing a second conductive material on the second surface of the organic polymeric ferroelectric precursor material to form a stack, wherein the organic polymeric ferroelectric precursor material is positioned at least partially between the first and second conductive materials;
  (c) subjecting the stack to a first temperature above a melting temperature of the organic polymeric ferroelectric precursor material to form an organic polymeric ferroelectric material having ferroelectric hysteresis properties; and
  (d) subjecting the stack to a second temperature below the melting temperature of the organic polymeric ferroelectric precursor material to densify the organic polymeric ferroelectric material and to obtain a thin film ferroelectric device.

2. The method of claim 1, wherein obtaining the thin film ferroelectric device comprises producing a ferroelectric capacitor, transistor, diode, piezoelectric, pyroelectric device, or any combination thereof.

3. The method of claim 1, wherein the first temperature in step (c) is 167° C. to 200° C., and the second temperature in step (d) is 100° C. to less than 167° C. or the first temperature in step (c) is 175° C. to 185° C., and the second temperature in step (d) is 145° C. to 155° C.

4. The method of claim 1, wherein steps (c) and (d) are continuous such that the stack in step (c) is cooled from the first temperature to the second temperature.

5. The method of claim 1, wherein the stack is subjected to the (i) first temperature for 1 to 60 minutes and (ii) the second temperature for 10 to 70 minutes.

6. The method of claim 1, wherein the organic polymeric ferroelectric precursor material is deposited in step (a) as a film having a thickness of less than 1 μm and the resulting organic polymeric ferroelectric material in step (d) is in the form of a film having a thickness of less than 1 μm.

7. The method of claim 1, wherein the organic polymeric ferroelectric precursor material, prior to step (c), has not previously been subjected to a thermal treatment for more than 55 minutes.

8. The method of claim 7, wherein the organic polymeric ferroelectric precursor material, prior to step (c), has not previously been subjected to a thermal treatment for more than 30 minutes.

9. The method of claim 7, wherein the organic polymeric ferroelectric precursor material, prior to step (c), has not previously been subjected to a thermal treatment for more than 5 minutes.

10. The method of claim 7, wherein the organic polymeric ferroelectric precursor material, prior to step (c), has not previously been subjected to any thermal treatment.

11. The method of claim 1, wherein the first and second conductive materials are not subjected to tensile stress during steps (a) to (d).

12. The method of claim 1, wherein the organic polymeric ferroelectric precursor material in steps (a) and (b) does not exhibit ferroelectric hysteresis properties.

13. The method of claim 1, wherein a crystalline phase is formed in the organic polymeric ferroelectric precursor material in step (c) to form the organic polymeric ferroelectric material having ferroelectric hysteresis properties.

14. The method of claim 1, wherein interfacial cracks present in the organic polymeric ferroelectric material having ferroelectric hysteresis properties obtained in step (c) are substantially removed in step (d), thereby reducing leakage current in the organic polymeric ferroelectric material when compared with the organic polymeric ferroelectric material obtained in step (c).

15. The method of claim 1, wherein the produced thin film ferroelectric device exhibits a polarization vs. electric field (P-E) hysteresis loop that is measurable as low as 1 Hz.

16. The method of claim 1, wherein the organic polymeric ferroelectric precursor material is not in crystalline or semi-crystalline form prior to performing step (c), and wherein the organic polymeric ferroelectric material having ferroelectric hysteresis properties is in crystalline or semi-crystalline form after performing step (c).

17. The method of claim 1, wherein the polymeric ferroelectric precursor material is solubilized in a solvent prior to performing step (c), and wherein the solvent is substantially removed in step (c) to produce the organic polymeric ferroelectric material having ferroelectric hysteresis properties.

18. The method of claim 1, wherein the organic polymeric ferroelectric precursor material in step (a) comprises a ferroelectric polymer.

19. The method of claim 1, wherein steps (a) to (d) are performed in a roll-to-roll process.

20. A ferroelectric device prepared by the method of claim 1, wherein the ferroelectric device includes the first conductive material and the second conductive material, wherein at least a portion of the organic polymeric ferroelectric material is between at least a portion of the first conductive material and at least a portion of the second conductive material.

21. A method for producing a thin film ferroelectric device, the method comprising:
(a) subjecting a stack comprising a first conductive material, a second conductive material, and an organic polymeric ferroelectric precursor material at least partially between the first and second conductive materials to a first temperature above a melting temperature of the organic polymeric ferroelectric precursor material to form an organic polymeric ferroelectric material having ferroelectric hysteresis properties; and
(b) subjecting the stack to a second temperature below the melting temperature of the organic polymeric ferroelectric precursor material to densify the organic polymeric ferroelectric material and to obtain a thin film ferroelectric device.

* * * * *